US012598430B2

(12) United States Patent
Leahy et al.

(10) Patent No.: US 12,598,430 B2
(45) Date of Patent: Apr. 7, 2026

(54) MEMS MICROPHONE

(71) Applicants: Soundskrit Inc., Montreal (CA); The Research Foundation for The State University of New York, Albany, NY (US)

(72) Inventors: Stephane Leahy, Montreal (CA); Sahil Gupta, Montreal (CA); Wan-Thai Hsu, Saline, MI (US); Mohsin Nawaz, Ann Arbor, MI (US); Carly Stalder, Montreal (CA); Ravi Patel, Ann Arbor, MI (US); Mohamed El Badawe, Montreal (CA); Ronald Miles, Newark Valley, NY (US)

(73) Assignees: Soundskrit Inc, Montreal (CA); The Research Foundation for the State University of New York, Albany, NY (US)

( * ) Notice: Subject to any disclaimer, the term of this patent is extended or adjusted under 35 U.S.C. 154(b) by 180 days.

(21) Appl. No.: 18/570,564

(22) PCT Filed: Jun. 14, 2022

(86) PCT No.: PCT/US2022/033421
§ 371 (c)(1),
(2) Date: Dec. 14, 2023

(87) PCT Pub. No.: WO2022/266090
PCT Pub. Date: Dec. 22, 2022

(65) Prior Publication Data
US 2024/0284122 A1      Aug. 22, 2024

Related U.S. Application Data

(60) Provisional application No. 63/210,205, filed on Jun. 14, 2021.

(51) Int. Cl.
*H04R 19/04* (2006.01)
*B81B 3/00* (2006.01)

(52) U.S. Cl.
CPC ........... *H04R 19/04* (2013.01); *B81B 3/0021* (2013.01); *B81B 2201/0257* (2013.01);
(Continued)

(58) Field of Classification Search
CPC .............. H04R 19/04; H04R 2201/003; B81B 3/0021; B81B 2201/0257;
(Continued)

(56) References Cited

U.S. PATENT DOCUMENTS

| | | | |
|---|---|---|---|
| 8,822,254 B2 | 9/2014 | Van Beek et al. | |
| 2003/0167843 A1* | 9/2003 | Hollocher | G01P 15/18 73/514.16 |

(Continued)

FOREIGN PATENT DOCUMENTS

| | | |
|---|---|---|
| WO | 2011001293 A2 | 1/2011 |
| WO | 2019226958 A1 | 11/2019 |

OTHER PUBLICATIONS

International Search Report and Written Opinion of the International Searching Authority from International Patent Application No. PCT/US2022/033421, dated Aug. 30, 2022, 6 pages.

(Continued)

*Primary Examiner* — Oyesola C Ojo
(74) *Attorney, Agent, or Firm* — Lempia Summerfield Katz LLC

(57) ABSTRACT

A microelectromechanical (MEMS) transducer includes a substrate, a moveable electrode supported by the substrate, and a pair of fixed electrodes supported by the substrate, each fixed electrode of the pair of fixed electrodes being configured as a bias or sense electrode. The pair of fixed electrodes are disposed in a stacked arrangement. An end of (Continued)

the moveable electrode is configured for vibrational movement along the stacked arrangement during excitation of the moveable electrode. The pair of fixed electrodes are laterally spaced apart from the end of the moveable electrode to establish a capacitance indicative of the vibrational movement.

23 Claims, 23 Drawing Sheets

(52) U.S. Cl.
CPC .................. *B81B 2203/0118* (2013.01); *B81B 2203/0307* (2013.01); *B81B 2203/04* (2013.01); *B81B 2207/03* (2013.01); *H04R 2201/003* (2013.01)

(58) Field of Classification Search
CPC ..... B81B 2203/0118; B81B 2203/0307; B81B 2203/04; B81B 2207/03
See application file for complete search history.

(56) References Cited

U.S. PATENT DOCUMENTS

| | | | | |
|---|---|---|---|---|
| 2006/0233401 | A1* | 10/2006 | Wang | H04R 19/005 |
| | | | | 381/176 |
| 2009/0201623 | A1* | 8/2009 | Steeneken | H01G 5/40 |
| | | | | 361/290 |
| 2011/0049653 | A1* | 3/2011 | Kanemoto | G01P 15/125 |
| | | | | 257/E21.214 |
| 2011/0255228 | A1* | 10/2011 | Kimura | G01H 11/06 |
| | | | | 361/679.01 |
| 2013/0221453 | A1* | 8/2013 | Dehe | H04R 19/005 |
| | | | | 257/E29.324 |
| 2016/0257557 | A1* | 9/2016 | Wu | G01P 15/125 |
| 2022/0057625 | A1* | 2/2022 | Hirata | G02B 26/0833 |

OTHER PUBLICATIONS

Miles et al., "A flow-sensing velocity microphone", 2019, 4 pages.
R.N. Miles et al., "Sound-Induced Motion of a Nanoscale Fiber", Journal of Vibrations and Acoustics, 2017, 7 pages.
R.N. Miles, "A compliant capacitive sensor for acoustics: Avoiding electrostatic forces at high bias voltages", IEEE Sensors Journal, 2018, 8 pages.
Zamanzadeh et al., "A resonant pressure MEMS sensor based on levitation force excitation detection", Nonlinear Dynamics, Mar. 28, 2020, 19 pages.
Zhou et al., "Sensing fluctuating airflow with spider silk", PNAS, Nov. 14, 2017, pp. 12120-12125, vol. 114, No. 46.
International Preliminary Report on Patentability from International Patent Application No. PCT/US2022/033421, dated Dec. 14, 2023, 5 pages.

* cited by examiner

MEMS MICROPHONE

CROSS-REFERENCE TO RELATED APPLICATION

This U.S. National Phase application is based on International Application No. PCT/US2022/033421, filed Jun. 14, 2022, which claims the benefit of U.S. provisional application entitled "MEMS Flow-Based Microphone," filed Jun. 14, 2021, and assigned Ser. No. 63/210,205, the entire disclosures of which are hereby expressly incorporated by reference. Priority benefit of these earlier filed applications is hereby claimed.

BACKGROUND OF THE DISCLOSURE

Field of the Disclosure

The disclosure relates generally to microelectromechanical (MEMS) microphones.

Brief Description of Related Technology

Directional microphones are designed to have high sensitivity to sound travelling in one direction and low sensitivity to sound travelling in another direction. In this manner, directional microphones have a selectivity towards sounds emanating from a certain direction. When combined with further processing capabilities, directionality allows acoustic sensing devices to localize and separate sound sources based on their direction.

Traditional directional microphones respond to the pressure of incoming sound waves. A transducer, or membrane, that moves in response to incoming sound is encapsulated in a package. The membrane partitions the package into two air volumes, a front volume and a back volume. The microphone package further has two sound ports. A first sound port couples the front volume of air to the outside ambient air at a first location. A second sound port couples the back volume of air to the outside ambient air at a second location spaced at some distance from the first location. As a sound wave travels past the microphone, the sound wave creates a first local pressure at the location of the first sound port and a second local pressure at the location of the second sound port. The difference in the first pressure and second pressure exerts a force on the membrane and cause the membrane to vibrate. The vibrations of the MEMS membrane are then converted to an electrical signal through one of a variety of transduction mechanisms such as capacitive, piezoelectric, optical, or piezoresistive readout.

In a typical capacitive transducer, a fixed electrode, or backplate, is disposed above or below the MEMS membrane, or moving electrode, and creates a parallel plate capacitance arrangement with the membrane. As the membrane vibrates in response to pressure differences across opposing sides of its surface, the gap between the fixed electrode and moving membrane decreases and increases in an oscillatory manner. This corresponds to a changing capacitance that can be sensed and amplified as an electrical signal using an application specific circuit (ASIC).

In some parallel plate capacitor cases, there may be a second fixed electrode, or backplate, so that the membrane has a backplate both above and below its surface. In this case, the transducer has two capacitances that change in opposite directions from one another as the membrane vibrates. The difference between the two changing capacitances can be used to provide a signal corresponding to the captured sound wave. In still other cases, the transducer has a single fixed electrode sandwiched between two moving membranes that vibrate synchronously when excited by an external stimulus. Again, two opposing capacitances are created as the moving membranes vibrate.

SUMMARY OF THE DISCLOSURE

In accordance with one aspect of the disclosure, a microelectromechanical (MEMS) transducer includes a substrate, a moveable electrode supported by the substrate, and a pair of fixed electrodes supported by the substrate, each fixed electrode of the pair of fixed electrodes being configured as a bias electrode or as a sense electrode. The pair of fixed electrodes are disposed in a stacked arrangement. An end of the moveable electrode is configured for vibrational movement along the stacked arrangement during excitation of the moveable electrode. The pair of fixed electrodes are laterally spaced apart from the end of the moveable electrode to establish a capacitance indicative of the vibrational movement.

In connection with any one of the aforementioned aspects, the devices described herein may alternatively or additionally include or involve any combination of one or more of the following aspects or features. The moveable electrode is configured as a cantilever. The cantilever is warped in the direction of the vibrational movement apart from the vibrational movement. The cantilever has a resting deflection that corresponds with an equilibrium position attained via application of bias voltages between the moveable electrode and the pair of fixed electrodes. The moveable electrode includes a porous plate. The moveable electrode further includes a plurality of fingers extending outward from an edge of the porous plate. The moveable electrode includes an anchor and a plurality of porous plates. Each porous plate of the plurality of porous plates is connected to the anchor. The substrate includes a hole. The anchor is suspended over the hole. The moveable electrode includes an array of beams. The array of beams includes fixed-fixed beams and fixed-free beams disposed in an alternating arrangement. The fixed-free beams are wider than the fixed-fixed beams. The array of beams includes a plurality of fixed-free beams of differing lengths. Outer beams of the array of beams are configured as fixed-fixed beams. Outer beams of the array of beams are wider than all other beams in the array of beams. Each fixed electrode of the pair of fixed electrodes includes a set of beams, the sets of beams being interleaved in a side-by-side arrangement with the array of beams of the moveable electrode. The substrate includes a hole. The fixed electrode includes two sets of beams suspended over the hole. The fixed electrode further includes an anchor to which the two sets of beams are connected. The anchor is disposed between the two sets of beams and suspended over the hole. The stacked arrangement is configured such that, during the vibrational movement, the moveable electrode reaches or crosses a midpoint of at least one of the pair of fixed electrodes. First and second fixed electrodes of the pair of fixed electrodes have positive and negative biases, respectively, with respect to the moveable electrode. A device includes a MEMS transducer as described herein, the device further including an amplifier coupled to the moveable electrode. A device includes a MEMS transducer, the device further including an amplifier coupled to one or both of the pair of fixed electrodes.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
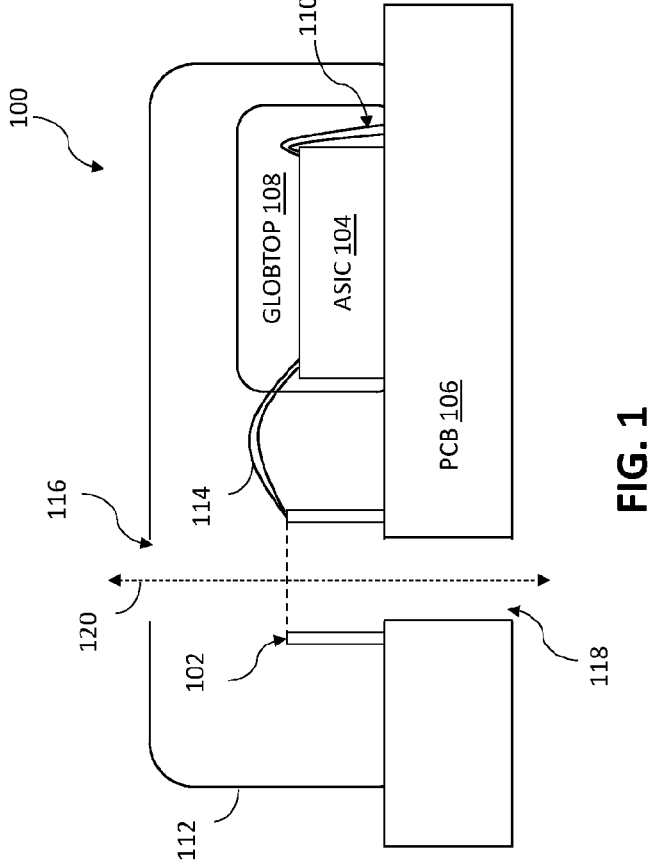
FIG. 1 is a cross-sectional, schematic view of a MEMS transducer in accordance with one example.

The embodiments of the disclosed devices may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Transducers are described in which an end of a moveable electrode is configured for vibrational movement along a stacked arrangement of a pair of fixed electrodes. The fixed electrodes are laterally spaced apart from the end of the moveable electrode to establish a capacitance indicative of the vibrational movement. The stacked arrangement of the fixed electrodes and lateral spacing of the moveable and fixed electrodes of the disclosed transducers leads to a capacitive sensing mechanism that deviates from traditional parallel plate sensing architectures employed by traditional MEMS sensors.

In some cases, a cantilever of the moveable electrode is warped in the direction of the vibrational movement. For instance, the warped nature of the cantilever corresponds with an equilibrium position or other resting deflection. The equilibrium position may be attained via application of bias voltages (e.g., positive and negative bias voltages) between the moveable electrode and the pair of fixed electrodes.

In some cases, movement of one of the moveable electrode is driven (e.g., partially driven) by forces due to the flow of a viscous medium past the electrode. For instance, the transducer may respond to acoustic excitation or air flow (e.g., a microphone). The transducer may be oriented such that sound propagating through air flows through its moving (or moveable) element. As the air flows across the moving element, the air flow induces a viscous drag force (e.g., friction) that excites the element and, in some cases, dominates the motion of the element. This type of behavior may be obtainable using small microstructures constructed through MEMS fabrication techniques. Because the moving element will move in the same direction as the air flow, or drag force, the transducer, or sensor, is inherently directional. Air that flows in other directions (i.e., that is not through the moving element) will not excite a response, or at least the response will be substantially attenuated.

In accordance with another aspect, the disclosed microphones may avoid the use of backplates commonly employed by capacitive transducers. The absence of backplates, may minimize or lower the acoustic losses experienced by certain capacitive transducers.

The disclosed microphones may be useful in a wide variety of applications and contexts, including, for instance, various consumer devices such as smartphones, laptops, and earbuds. The configuration of the disclosed microphones may be useful in connection with any device in which there is an interest in listening to sound originating from a specific direction with greater sensitivity than sound originating from other directions.

Although described in connection with microphones, the disclosed transducers may be used in other applications and contexts. For instance, the disclosed transducers are useful in connection with accelerometers, gyroscopes, inertial sensors, pressure sensors, gas sensors, and other sensor devices. In these examples, as the transducer experiences a vibratory event (e.g., an acceleration), the transducer vibrates, and the signal captured by the transducer then serves as an approximation of the motion seen by the transducer. The disclosed transducers are described in the context of excitation by sound waves. However, alternative or additional stimuli may excite the disclosed transducers in other contexts.

Turning now to FIG. 1, a transducer 100 in accordance with one example is depicted. A microelectromechanical (MEMS) transducer, or sensing element, 102 is mounted our otherwise supported by a printed circuit board (PCB) 106. The PCB 106 may include one or multiple layers. The transducer 100 further includes an application-specific integrated circuit (ASIC) 104. The ASIC 104 is configured to read out the electrical signal from the MEMS transducer 102 and covered by a protective glob top 108. The ASIC 104 is also attached to the PCB 106 and may be electrically connected to conductive traces on the PCB 106 by wire bonds 110. Both the MEMS 102 and the ASIC 104 are encapsulated by a lid or other enclosure 112. The lid may be composed of, or otherwise include, a metal, plastic, ceramic, or other material. The MEMS 102 and ASIC 104 may be electrically connected by wire bonds 114, either to each other, or directly to the PCB 106. The MEMS 102, ASIC 104, and lid 112 may also be attached using other methods known to those skilled in the art. In another instance, the MEMS 102 may be attached to the PCB 106 using flip chip techniques. Transducer 100 also has two openings, or ports, 116 and 118. In one example, a first port 116 may sit on the lid 112 and a second port 118 may be embedded in the PCB 106. In another example, the first and second port 116 and 118 may sit on the same surface (e.g., PCB 106 or lid 112).

In one example, the transducer 100 is configured to respond to acoustic stimulus (e.g., as a microphone).

Figure 2:
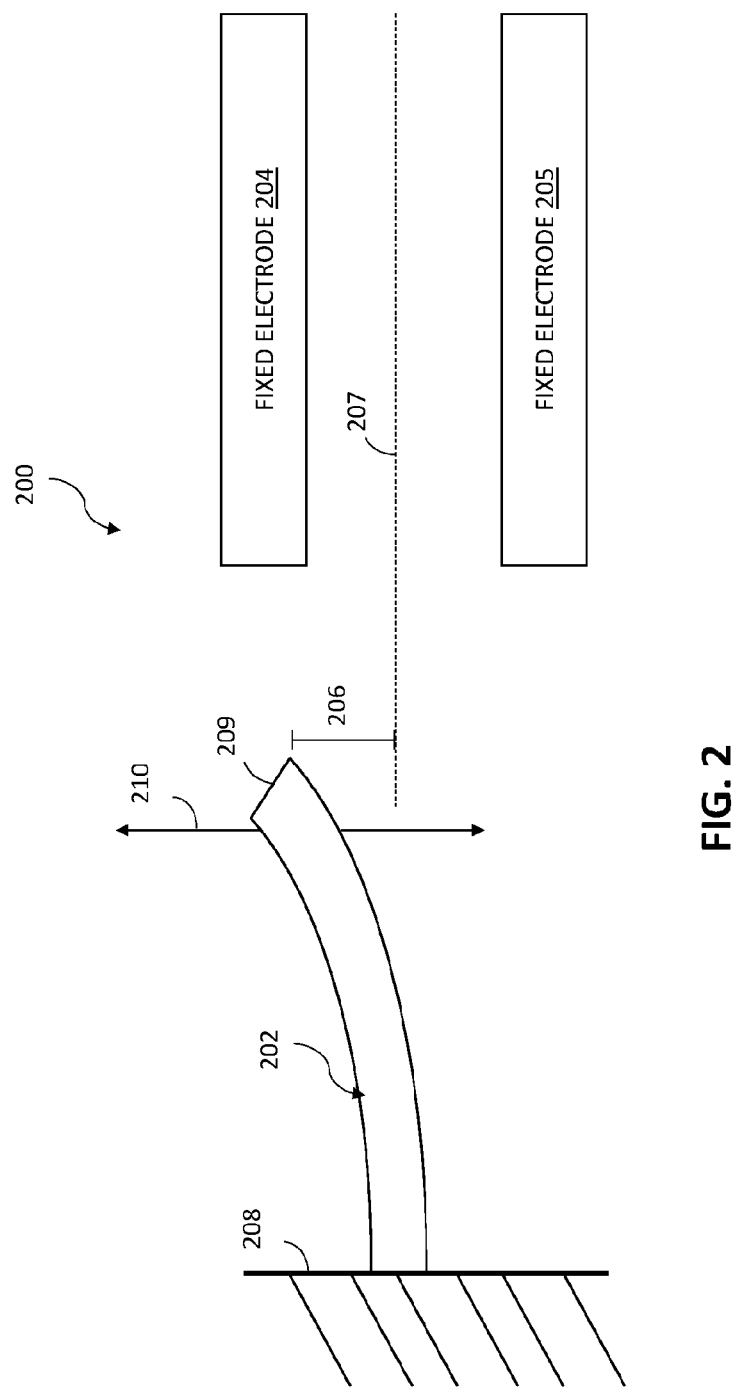
FIG. 2 is a cross-sectional (or side), schematic view of a MEMS transducer in accordance with one example.

FIG. 2 is a cross-sectional (or side) view of a MEMS transducer 200 with side-by-side electrodes in accordance with another example. The MEMS transducer 200 includes of a moving element 202, a first fixed electrode 204, and a second fixed electrode 205. The second fixed electrode 205 may be positioned such that the second fixed electrode is below the first fixed electrode 204. The moving electrode may be anchored on at least one side 208 and free to vibrate along the direction 210. The fixed electrodes 204 and 205 are constructed such that they exhibit no, or reduced, motion along the direction 210 relative to moving element 202 when subject to the same external stimulus. Thus, the position of the moving element 202 along direction 210 relative to the fixed electrodes 204 and 205 changes in response to acoustic stimulus. The moving element 202 may be sufficiently thin (e.g., less than 2 microns) such that the motion of the moving element is primarily dominated by the surrounding medium in which the moving element vibrates (e.g., the moving element is driven by the movement of air around the moving element). The moving element 202 has an initial deflection 206 relative to the midpoint 207 between the two fixed electrodes 204 and 205. In some examples, the initial deflection 206 is negligible or nonexistent such that the tip of the moving element 209 sits at the same position as the midpoint 207. In other examples, the initial deflection 206 is such that the tip of the moving element 209 sits above or below the midpoint 207.

The moving element 202 and fixed electrodes 204 and 205 each have at least one conductive layer such that a first capacitance is established between the moving electrode 202 and the first fixed electrode 204 and a second capacitance is established between the moving electrode 202 and second fixed electrode 205. During operation, the moving electrode 202 may vibrate in response to an acoustic stimulus such as an impinging sound wave along direction 210 such that the moving element's tip 209 crosses the midpoint 207. In some examples, the tip 209 may oscillate above and below the midpoint 207 for a subset of sound waves with a pressure level between 20 μPa and 200 Pa and for a subset of sound waves with a frequency between 20 Hz and 20 kHz. As moving electrode 202 vibrates along direction 210 in response to an acoustic stimulus (e.g., sound waves), the first and second capacitance will change. A fixed bias voltage may be placed on one or more of the electrodes 202, 204, and 205. As the moving electrode 202 moves along direction 210, this may result in a change in the charge and/or voltage seen at one of the more of the electrodes 202, 204, and 205. In one example, a bias voltage is placed on moving electrode 202, and the first and/or second fixed electrode 204 and/or 205 is connected to a voltage amplifier that holds the charge of the electrode constant and amplifies the voltage change seen as moving electrode 202 vibrates. In another instance, the first and/or second fixed electrode 304 and/or 305 may be connected to a charge amplifier that holds the voltage on the electrode constant and amplifies the charge change seen as moving electrode 202 vibrates. In some instances, the difference between the first fixed electrode 204 and second fixed electrode 205 may be amplified by a voltage amplifier or a charge amplifier. The bias voltage may have a DC voltage component, AC voltage component, or both. In yet another example, a first bias voltage is placed on the first fixed electrode 204 and a second bias voltage is placed on the second fixed electrode 205. The first and second bias voltage may be different. For example, they may have a different magnitude and/or polarity. At least one of the two bias voltages may have a DC voltage component, AC voltage component, or both. The moving electrode 202 may be connected to a voltage amplifier that holds the charge on the moving electrode constant. As the moving electrode 202 vibrates, the moving electrode will experience a voltage change that is amplified by the voltage amplifier. Alternatively, the moving electrode 202 may be connected to a charge amplifier that holds the voltage on the moving electrode constant. In this case, as the moving electrode 202 vibrates, the moving electrode will experience a charge change that is amplified by the charge amplifier. In yet another example, the fixed electrodes 204 and 205 are configured to move and the moving electrode 202 is configured to remain relatively stationary. Any configuration may be used in which the electrode 202 moves relative to electrodes 204 and 205.

At least one bias voltage placed on any of the electrodes 202, 204, or 205 may change the initial deflection 206. In some examples, the bias voltage causes the tip of element 202 to get closer to midpoint 207. In other examples, the bias voltage causes the tip of element 202 to move further away from midpoint 207.

In some examples, the side-by-side configuration of the moving and fixed electrodes result in a dominant electrostatic force that is perpendicular to the direction of motion 210 of the moving element 202. The moving element 202 of transducer 200 may be constructed in such a way that the moving element is relatively stiff, or noncompliant, in the directions perpendicular to the direction of motion 210 of the moving element while compliant in the direction of the motion 210 of the moving element. The electrostatic force in the direction of the motion of the moving element 210 may be less than the electrostatic force in a direction perpendicular to 210.

The initial deflection 206 of the moving structure 202 may be sufficiently small such that the moving structure 202 remains close enough to the midpoint 207 such that the signal generated by the transducer 200 when under bias is relatively linear for typical sound waves propagating with a frequency between 20 Hz-20 kHz. In some examples, the initial deflection 206 may be less than 50 um.

In some examples, a first and second bias voltage may be placed on fixed electrodes 204 and 205 with opposite polarity. The initial deflection 206 may increase such that it moves away from the midpoint 207. A first bias voltage between positive 1V-50V may be used and a second bias voltage between negative 1V-50V may be used such that the vibration of the transducer 200 when under bias is relatively linear in response to stimulus from typical sound waves propagating with a frequency between 20 Hz-20 kHz.

In other examples, a bias voltage may be placed on moving electrode 202. The initial deflection 206 may decrease such that the initial deflection moves towards the midpoint 207.

Figure 3:
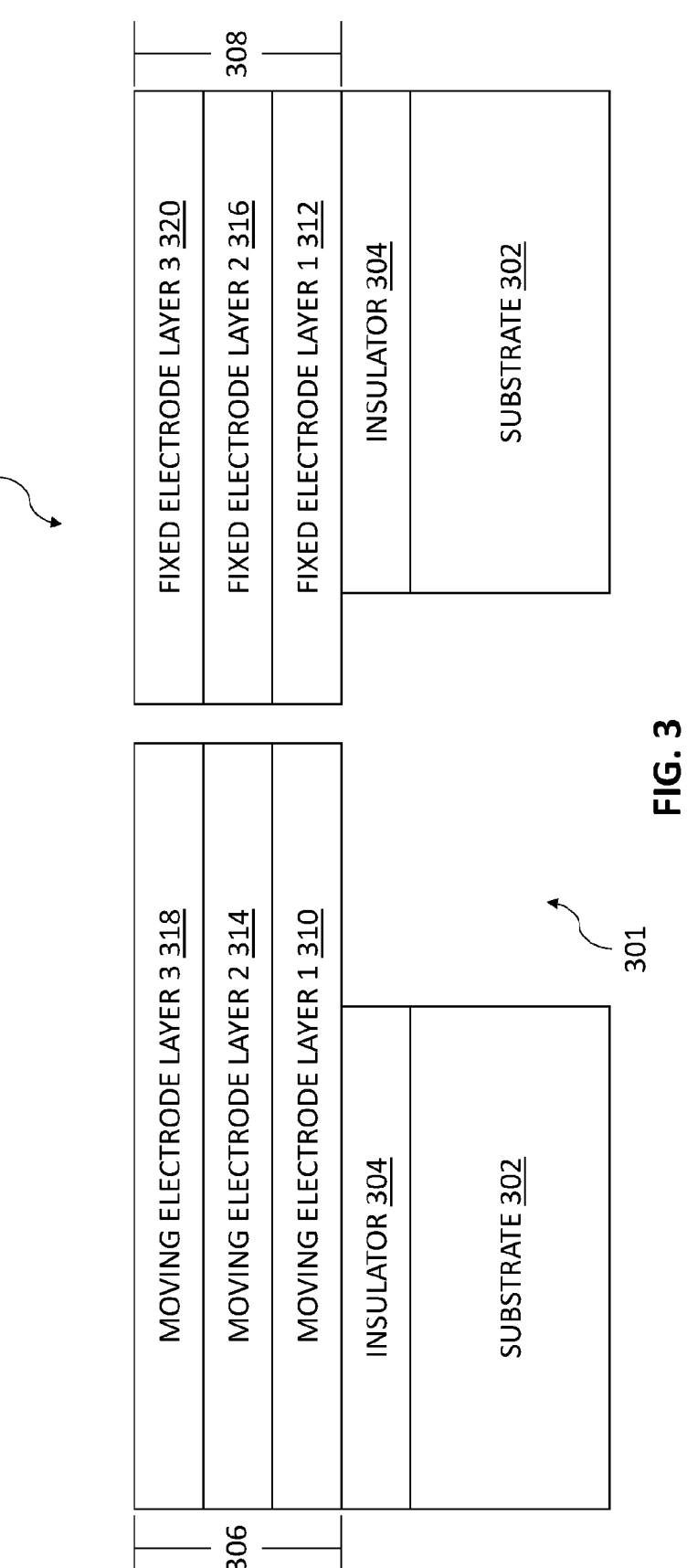
FIG. 3 is a cross-sectional (or side), schematic view of a MEMS transducer in accordance with one example.

FIG. 3 depicts a cross-sectional view of a transducer 300 in accordance with one example. The transducer 300 may operate in a manner similar to the example of FIG. 2. Transducer 300 includes at least one moving electrode 306 and at least one fixed electrode 308 that exhibits less motion when subject to an external stimulus relative to the moving electrode 306. The external stimulus may be, in some examples, sound waves. The moving electrode 306 is anchored on at least one side to substrate 302 through insulating layer 304 and is configured to vibrate along the axis transverse to its length. The insulator 304 may be composed of, or otherwise include, one or multiple layers including any combination of silicon, oxide, nitride, or a polymer. For example, insulator 304 may be composed of, or otherwise include, a thermal oxide. In some examples, the substrate 302 may be composed of, or otherwise include, silicon.

The moving electrode 306 may be composed of, or otherwise include, one or multiple layers with at least one conductive layer. In one example, the moving electrode 306 includes at least three layers 310, 314, and 318. The first moving electrode layer 310 and third moving electrode layer 318 are conductive, separated by a nonconductive, or insulating, second moving electrode layer 314. The second moving electrode layer 314 may be composed of, or otherwise include, one or multiple layers including any combination of silicon, oxide, nitride, or a polymer. The first moving electrode layer 310 and third moving electrode layer 318 may be composed of, or otherwise include, one or multiple layers including any combination of silicon, doped silicon, polysilicon, amorphous silicon, or a metal such as aluminum, gold, or tungsten. In one example, the first moving electrode layer 310 may have a thickness falling in a range from about 50 nm to about 1000 nm, but other thicknesses may be used. The second moving electrode layer 314 may have a thickness falling in a range from about 50 nm to about 1000 nm, but other thickness may be used. The third moving electrode layer 318 may have a thickness falling in a range from about 50 nm to about 1000 nm, but other thicknesses may be used. The thickness of the first moving electrode layer 310, second moving electrode layer 314, and/or third moving electrode layer 318 may be the same or different. In some examples, the first moving electrode layer 310 is the same thickness as the third moving electrode layer 318.

In one example, the first moving electrode layer 310 is given a first bias voltage and the third moving electrode layer 318 is given a second bias voltage. The first bias voltage and second bias voltage may be equal in amplitude and polarity, equal in amplitude but opposite in polarity, or equal in polarity but different in amplitude. At least one of the bias voltages may have a DC and/or an AC component. In another example, at least one of the moving electrode layers 310 and/or 318 is connected to an amplifier. For example, the first moving electrode layer 310 and third moving electrode layer 318 may be connected to the first and second input of a differential amplifier. In other examples, the first moving electrode layer 310 may be electrically connected to the third moving electrode layer 318. A cavity may be etched in the second moving electrode layer 314 and filled by the third moving electrode layer 318 to contact the first moving electrode layer 310. The moving electrode 306 may or may not have an initial deflection.

The fixed electrode 308 is anchored on at least one side to substrate 302 through insulating layer 304 and configured such that its motion is reduced relative to the moving electrode 306 when subject to the same external stimulus (e.g., sound waves). In some examples, the fixed electrode 306 maybe be anchored on multiple sides. The fixed electrode 308 may include of one or multiple layers with at least one layer being conductive. In one example, the fixed electrode includes at least three layers 312, 316, and 320. The first fixed electrode layer 312 and third fixed electrode layer 320 may be conductive and separated by a nonconductive, or insulating, second fixed electrode layer 316. The second fixed electrode layer 316 may include of one or multiple layers including any combination of silicon, oxide, nitride, or a polymer. The first fixed electrode layer 312 and third fixed electrode layer 320 may include of one or multiple layers including any combination of silicon, doped silicon, polysilicon, amorphous silicon, or a metal such as aluminum, gold, or tungsten. In one example, the first fixed electrode layer 312 is given a first bias voltage and the third fixed electrode layer 320 is given a second bias voltage. The first bias voltage and second bias voltage may be equal in amplitude and polarity, equal in amplitude but opposite in polarity, or equal in polarity but different in amplitude. At least one of the bias voltages may have a DC and/or an AC component. In another example, at least one of the fixed electrode layers 312 and/or 320 is connected to an amplifier. For example, the first fixed electrode layer 312 and third fixed electrode layer 320 may be connected to the first and second input of a differential amplifier. In other examples, the first fixed electrode layer 312 may be electrically connected to the third fixed electrode layer 320. A cavity may be etched in the second fixed electrode layer 316 and filled by the third fixed electrode layer 320 to contact the first moving electrode layer 312.

In some examples, one or multiple layers in the moving electrode 306 and fixed electrode 308 may be the same layer and deposited during the same manufacturing step. For example, the first moving electrode layer 310 and the first fixed electrode layer 312 may be the same layer. Alternatively or additionally, the moving electrode layers 314 and 318 may be the same layers as the fixed electrode layers 316 and 320, respectively.

Figure 4:
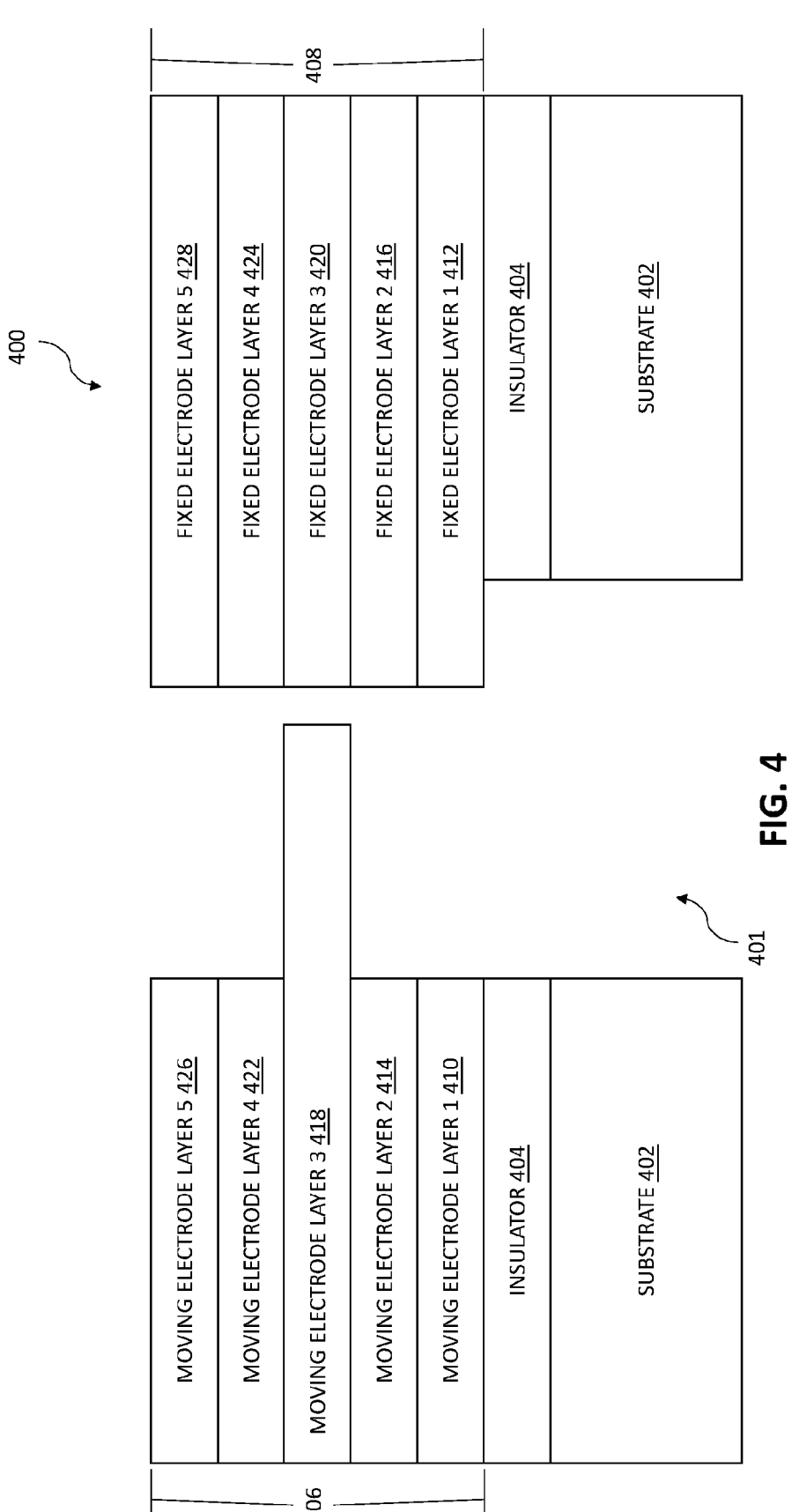
FIG. 4 is a cross-sectional (or side), schematic view of a MEMS transducer in accordance with another example.

FIG. 4 depicts a transducer 400 in accordance with another example. In contrast to transducer 300 (FIG. 3) with three electrode layers, each of moving and fixed electrodes 406, 408 of transducer 400 has five electrode layers. The transducer 400 has a cavity 401 in substrate 402. Fixed electrode 408 is configured so that the fixed electrode exhibits less motion than moving electrode 406 in response to the same external stimulus. The moving electrode 406 and fixed electrode 408 are anchored to substrate 402 through insulating layer 404. In one example, the moving electrode 406 contains a third layer 418 that protrudes with a greater length than the other layers 410, 414, 422, and 426. The third electrode layer 418 of the moving electrode 406 is designed to be compliant to external stimulus relative to the other layers 410, 414, 422, and 426 and fixed electrode 408. In another example, all the moving electrode layers 406 are suspended over cavity 401 and made compliant relative to the fixed electrode 408. Each layer in transducer 400 may have a thickness falling in a range from about 50 nm to about 1000 nm, but other thicknesses may be used.

In one example, a first bias voltage may be placed on the third moving electrode layer 418. The first fixed electrode layer 412 and the fifth fixed electrode layer 428 may be connected to a differential amplifier. In some instances, a second bias voltage may be placed on the third fixed electrode layer 420. The first bias voltage and second bias voltage may be equal in amplitude and polarity, equal in amplitude but opposite in polarity, or equal in polarity but different in amplitude. The first or second bias voltage may have a DC and/or an AC component.

In another example, the third moving electrode layer 418 may be connected to an amplifier. A first bias voltage may be placed on the first fixed electrode layer 412 and a second bias voltage may be placed on the fifth fixed electrode layer 428. The first bias voltage and second bias voltage may be equal in amplitude and polarity, equal in amplitude but opposite in polarity, or equal in polarity but different in amplitude. The first or second bias voltage may include a DC and/or an AC component. In some instances, a third bias voltage may be placed on the third fixed electrode layer 420. The third bias voltage may take any amplitude and polarity relative to the first and second bias voltage. The third bias voltage may also include a DC and/or AC component.

In some examples, one or multiple layers in the moving electrode 406 and fixed electrode 408 may be the same layer. For example, the first moving electrode layer 410 and the first fixed electrode layer 412 may be the same layer. Alternatively or additionally, one or more of the moving electrode layers 414, 418, 422, 426, may be the same layers as the fixed electrode layers 416, 420, 424, 428, respectively.

The examples in FIGS. 3 and 4 are depicted merely for illustrative purposes and by no means exclude alternative implementations of MEMS transducers that operate as described in FIG. 2. The moving and fixed electrodes may include any number of layers made of any combination of materials and biased in any number of configurations.

The following figures describe various examples of MEMS transducers having multiple fixed electrodes in a stacked arrangement. Furthermore, the electrodes are configured in a side-by-side configuration. While the examples below primarily refer to the use of the transducer as an acoustic transducer responding to sound waves, the same principles and designs may apply to other external stimuli.

Described below are a number of examples of transducers having an arrangement of moving and fixed electrodes configured as described above. While the layouts and arrangements of the moving and fixed electrodes vary, the electrodes and portions thereof may nonetheless be configured as described above. For instance, the views depicted in FIGS. 2-4 may correspond with a simplified view of a section or side of the electrode arrangements of the examples described below.

Figure 5:
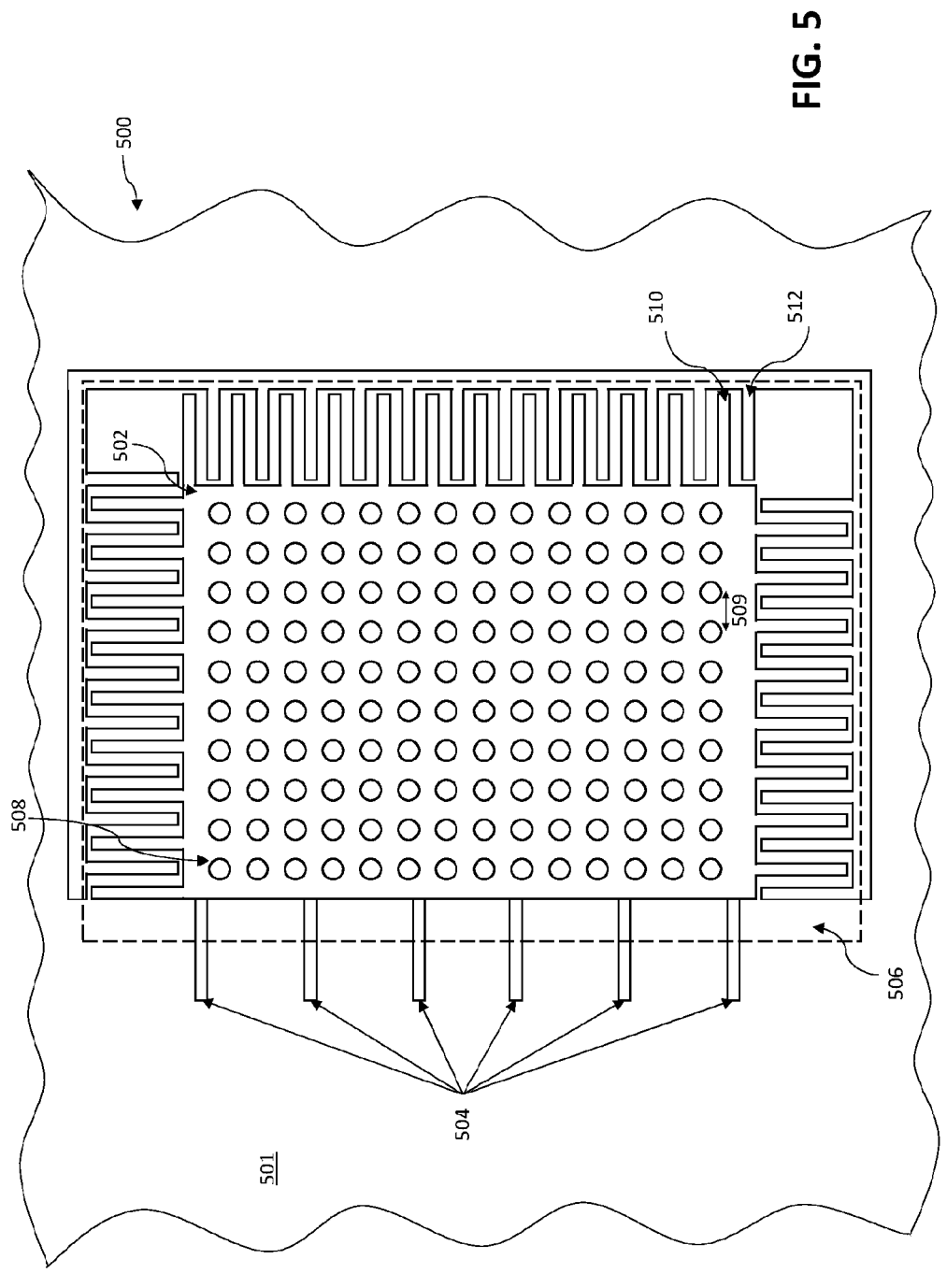
FIG. 5 is a top, schematic view of a MEMS transducer with a plate-like diaphragm in accordance with one example.

FIG. 5 depicts a transducer 500 with a plate-like diaphragm in accordance with one example. The transducer 500 includes a diaphragm 502 that is attached to a surrounding substrate 501 on one end by one or multiple anchors 504. The substrate 501 has a cavity 506 above which the diaphragm 502 is positioned. The cavity 506 may be formed through various microfabrication practices including, for instance, deep reactive ion etching (DRIE). The diaphragm, or plate, 502 includes one or more holes 508. The holes have a spacing 509 between them. In this manner, the diaphragm

502 is considered a porous plate. Attached to the free edges of diaphragm 502 are one or more fingers 510. The fingers 510 are configured so that the fingers move with the diaphragm 502. The diaphragm 502 and fingers 510 may thus be considered a single composite moving structure, or electrode. This moving electrode includes at least one conductive layer.

The transducer 500 includes fingers 512 fixed to the substrate 501. As the transducer 500 is excited by a sound wave, the fixed fingers 512 do not move, or move relatively less than fingers 510. Fingers 512 include at least one conductive layer such that a capacitance is formed between fingers 510 and 512. As the diaphragm 502 vibrates, the gap between fingers 510 and 512 changes. This creates a change in capacitance between fingers 510 and 512 that can be converted into an electronic signal as described in previous figures.

The anchors 504 may be configured as, or otherwise include, a single anchor that extends across the width of diaphragm 502, a single anchor with a width less than that of diaphragm 502, or multiple anchors with widths less than diaphragm 502. The top view profile of the anchors 502 may be rectangular, elliptical, triangular, or any other geometrical shape. In some examples, one or more of the anchors 504 may include fillets, or curved corners, at the connection point between the anchor 504 and diaphragm 502 and/or the connection between the anchor 502 and surrounding substrate 501. In some examples, the thickness of the anchors 504 may be greater than the thickness of the diaphragm 502. Similarly, one or more of the anchors 504 may have different thicknesses and/or widths from one another. The transducer 500 may be designed such that the transducer has a first resonant frequency in the audio band. For example, the first resonant frequency of the transducer 500 may fall in a range from about 500 Hz to about 5 kHz. Additionally, the transducer 500 may have a second resonant frequency that is outside of the audio band (e.g., greater than 20 kHz).

The diaphragm 502 is illustrated as a rectangle for ease of illustration. The diaphragm 502 may have a top profile that is rectangular, circular, elliptical, triangular, or any other geometrical shape. Similarly, the cavity 506 may have a top profile that is rectangular, circular, elliptical, triangular, or any other geometrical shape. The fingers 510 may cover the entire perimeter of the free ends of the diaphragm 502 or one or more smaller subsections. The fingers 510 may have a thickness that is different than the thickness of diaphragm 502 and/or fingers 512. The fingers 510 and/or 512 may have a top profile that is rectangular, circular, elliptical, triangular, or any other geometrical shape. In some examples, the gap between the fingers 510 and 512 may fall in a range from about 1 um to about 8 um, the length of fingers 510 and 512 may fall in a range from about 50 um to about 250 um, and the width of fingers 510 and 512 may fall in a range from about 1 um to about 20 um. In other examples, the length and/or width of fingers 510 and/or 512 may vary relative to one another. For example, the fingers 510 and/or 512 on at least one of the free sides of diaphragm may have a different length than the remaining sides. In some examples, the gap of at least one set of fingers 510 and 512 along the perimeter of diaphragm 502 may be different than that of another set of fingers. In some examples, the diaphragm 502 may include two or more diaphragms that are coupled electrically and/or mechanically.

In some examples, the spacing 509 between each of the holes 508 may be equal to the diameter of the holes 508. In other examples, the spacing 509 between each of the holes 508 may be less than or greater than the diameter of the holes 508. The spacing 509 may be determined as a ratio of the diameter of the holes 508. For example, the spacing 509 may be half, twice, three times, or four times the diameter of the holes 508. In some examples, the holes 508 may have a diameter that falls in a range from about 2 um to about 60 um and the spacing 509 may fall in a range from about 2 um to about 100 um. In one example, the holes 508 have a diameter of 4 um and the spacing 509 between the holes is 8 um. In yet another example, the holes 508 may vary in size and/or spacing from one another. For example, at least one of the holes 508 may be smaller than another hole on diaphragm 502. The holes 508 may cover the entire surface of diaphragm 502 or one or multiple subsections of diaphragm 502. Furthermore, the holes 508 may have a profile that is rectangular, circular, elliptical, triangular, hexagonal, or any other geometrical shape.

Figure 6:
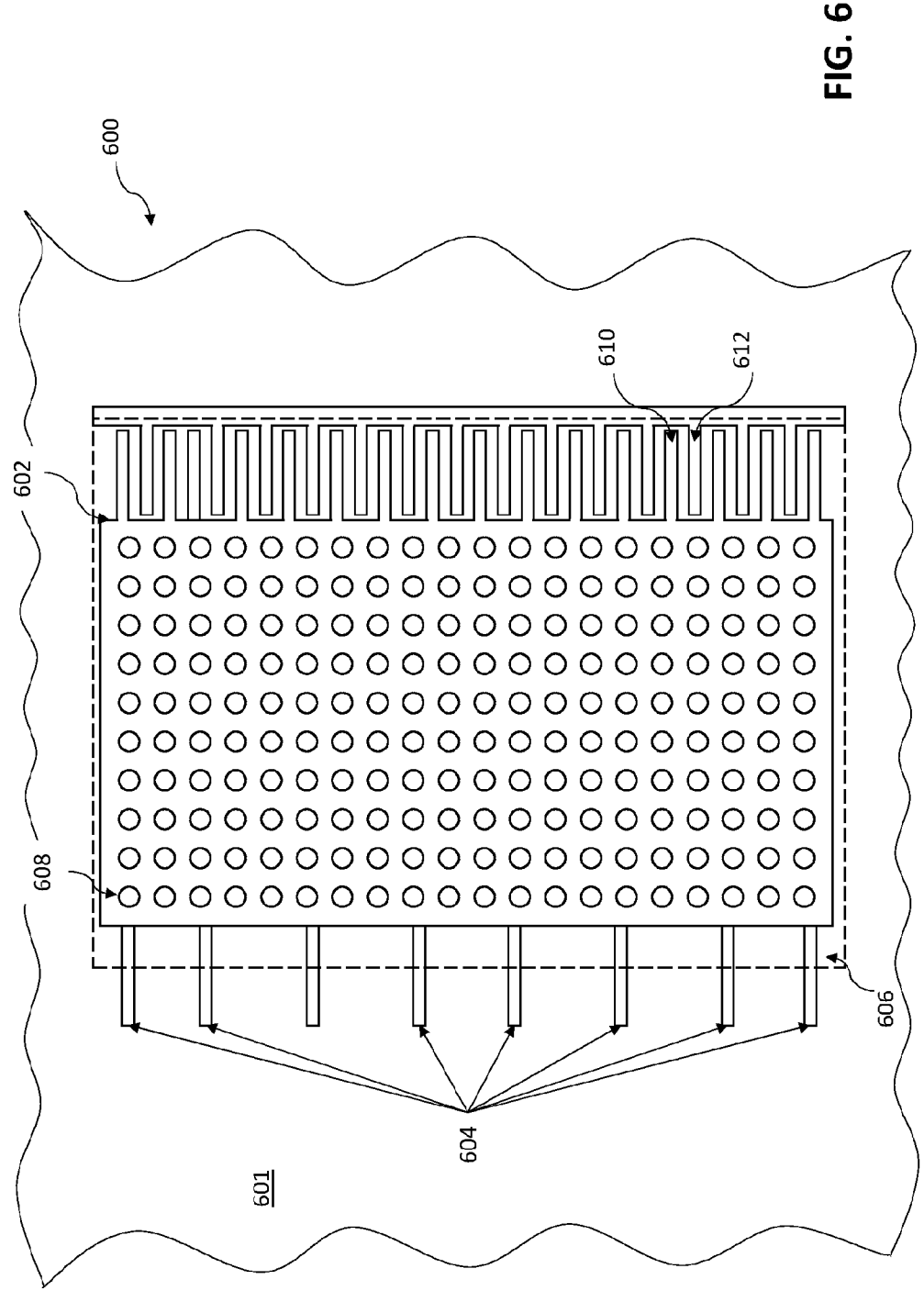
FIG. 6 is a top, schematic view of a MEMS transducer with a plate-like diaphragm in accordance with another example.

FIG. 6 depicts a transducer 600 in which fingers are only placed along one edge of a plate-like diaphragm in accordance with one example. The transducer 600 includes a diaphragm 602 that is attached to a surrounding substrate 601 on one end by one or multiple anchors 604 to a substrate 601. The substrate 601 has a cavity 606 above which the diaphragm 602 is positioned. The diaphragm 602 has one or more holes 608. Fingers 610 are attached to the diaphragm 602 only at the free edge opposing the anchors 604 and form a capacitance with fixed fingers 612. In some examples, the diaphragm 602 may have a length that falls in a range from about 100 um to about 250 um while the fingers 610 have a length that falls in a range from about 100 um to about 250 um, but other lengths for the diaphragm and fingers may be used. In some examples, the fingers may occupy a length that falls in the range of about 45% to about 60% of the overall length of the transducer, but other lengths may be used.

Figure 7:
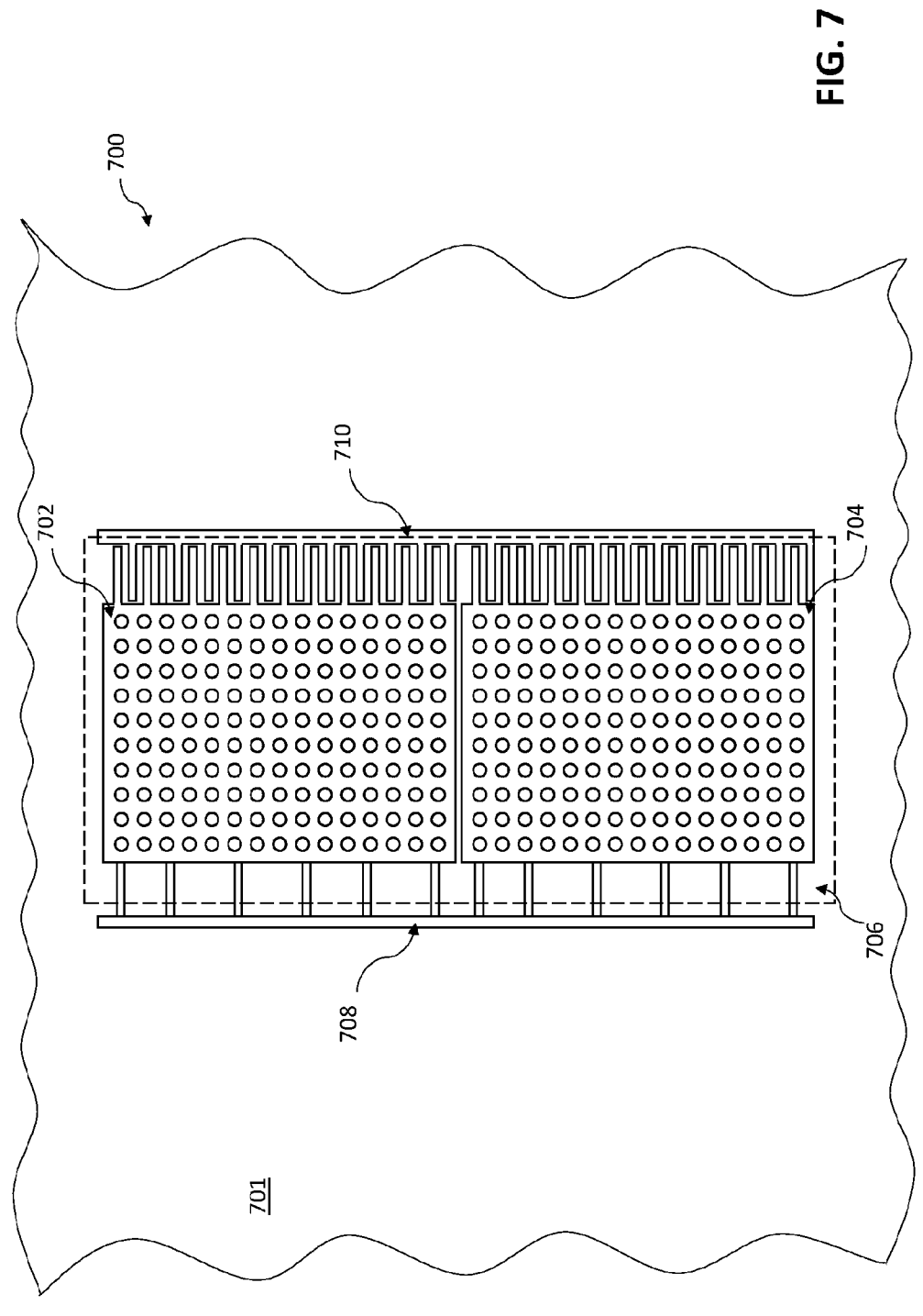
FIG. 7 is a top, schematic view of a MEMS transducer with a plate-like diaphragm in accordance with yet another example.

FIG. 7 depicts a transducer 700 that includes multiple plate-like diaphragms in accordance with one example. Transducers 700 includes at least two diaphragms 702 and 704 suspended over cavity 706 in the substrate 701. The diaphragms 702 and 704 are electrically coupled by conductive trace 708 and the fixed fingers are coupled by conductive trace 710. In some examples, transducer 700 may include more than two diaphragms. The diaphragms may have equal dimensions, or at least one diaphragm may have different dimensions than the rest. For example, at least diaphragms of transducer 700 may have a different resonant frequency than the rest. Conductive traces 708 and/or 710 may also be separated such that each diaphragm of transducer 700 is biased and/or amplified independently or connected externally.

Figure 8:
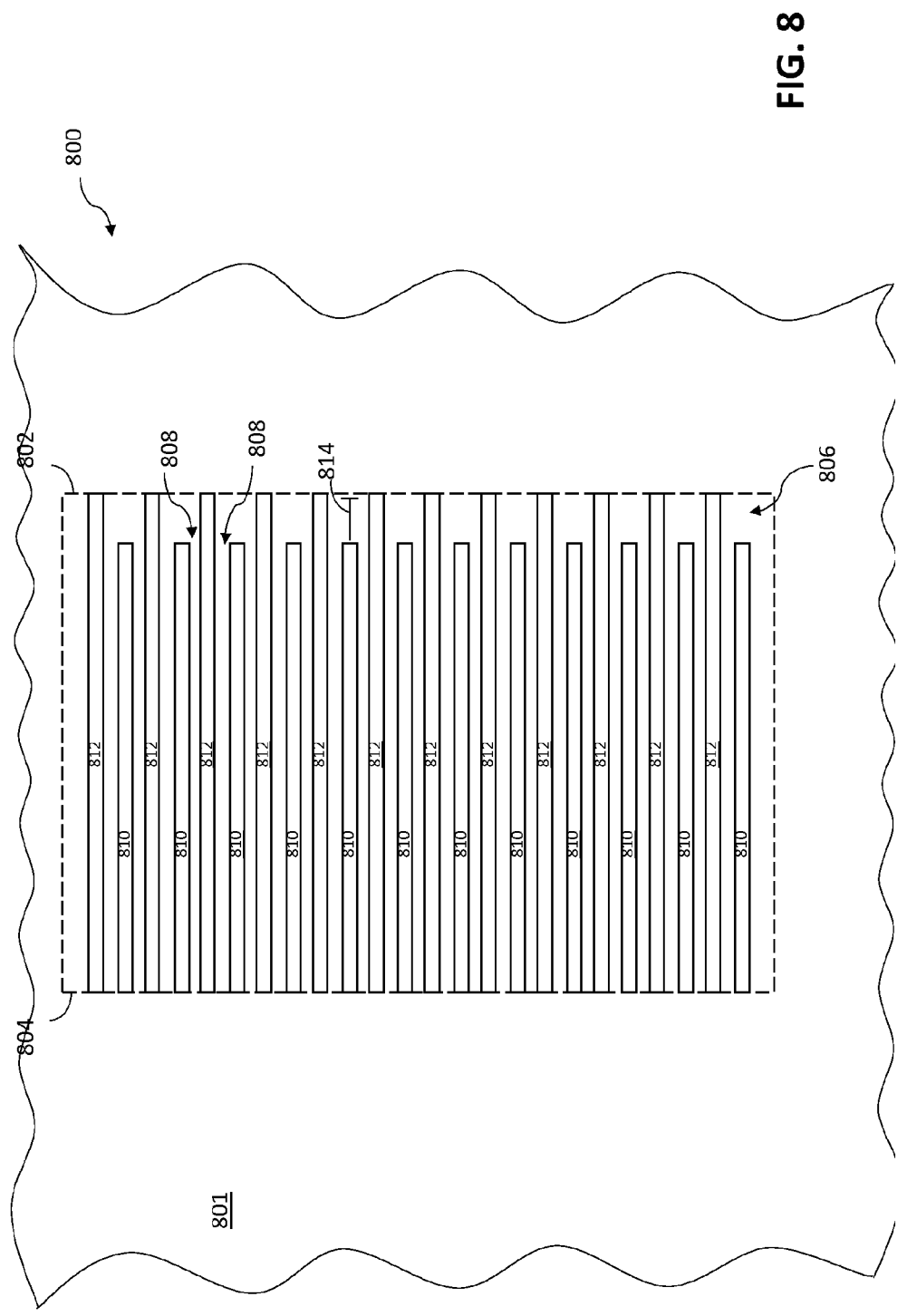
FIG. 8 is a top, schematic view of a MEMS transducer with an array of beams in accordance with one example.

In some examples, the length of fingers 710 and 712 of transducer 700 may be increased to increase the capacitance seen between them. FIG. 8 can be considered an extension of the transducer 700 in which the fingers extend completely through the diaphragm 702.

FIG. 8 depicts a transducer 800 having an array of beams in accordance with one example. Transducer 800 includes an array of one or more beams 810 interleaved between beams 812. The array of the transducer 800 is supported by substrate 801 with cavity 806 over which the beams 810 and 812 are suspended. Cavity 806 has edges 802 and 804. In one example, the beams 810 are cantilevers attached to the substrate on edge 804 and terminate at a distance 814 from the opposing edge 802 of the cavity 806 such that there is an air gap between the beams 810 and edge 802. The cantilever beams are accordingly referred to as fixed-free beams. Between the cantilever beams 810 are beams 812 that are anchored to the substrate on both edge 802 and edge 804.

Beams 812 are accordingly referred to as fixed-fixed beams. The fixed-free beams 810 and fixed-fixed beams 812 have air gaps 808 in between adjacent beams. The beams 810 and 812 each have at least one conductive layer such that there is a capacitance established between the beams as described herein. As the fixed-free beams vibrate, the gap 808 changes, creating a change in capacitance that can be converted into an electronic signal as described herein.

In some examples, the length of the beams 810 and 812 may fall in a range from about 50 um to about 1000 um, the width of the beams 810 and 812 may fall in a range from about 1 um to about 20 um, and the gap 808 may fall in a range from about 1 um to about 20 um, but other lengths, widths, and gap sizes may be used. In another example, the length, width, and/or thickness of at least one of the fixed-free beams 810 of transducer 800 may be different than at least one other of the fixed-free beams. In another example, the length, width, and/or thickness of at least one of the fixed-fixed beams 812 of transducer 800 may be different than at least one other of the fixed-fixed beams. In yet another example, the length, width, and/or thickness of at least one of the fixed-free beams 810 of transducer 800 may be different than at least one the fixed-fixed beams 812. In yet another example, at least one of the gaps 808 may be larger than one of the other gaps in transducer 800. The beams 810 and/or 812 may have a top view profile that is rectangular, circular, elliptical, triangular, or any other geometrical shape.

In other cases, the fixed-free beams 810 may instead be fixed-fixed and attached to substrate 801 on both edges 802 and 804 of cavity 806. The beams 810 are configured such that they are more compliant than beams 812. For example, beams 812 may have a greater thickness than beams 810.

Figure 9:
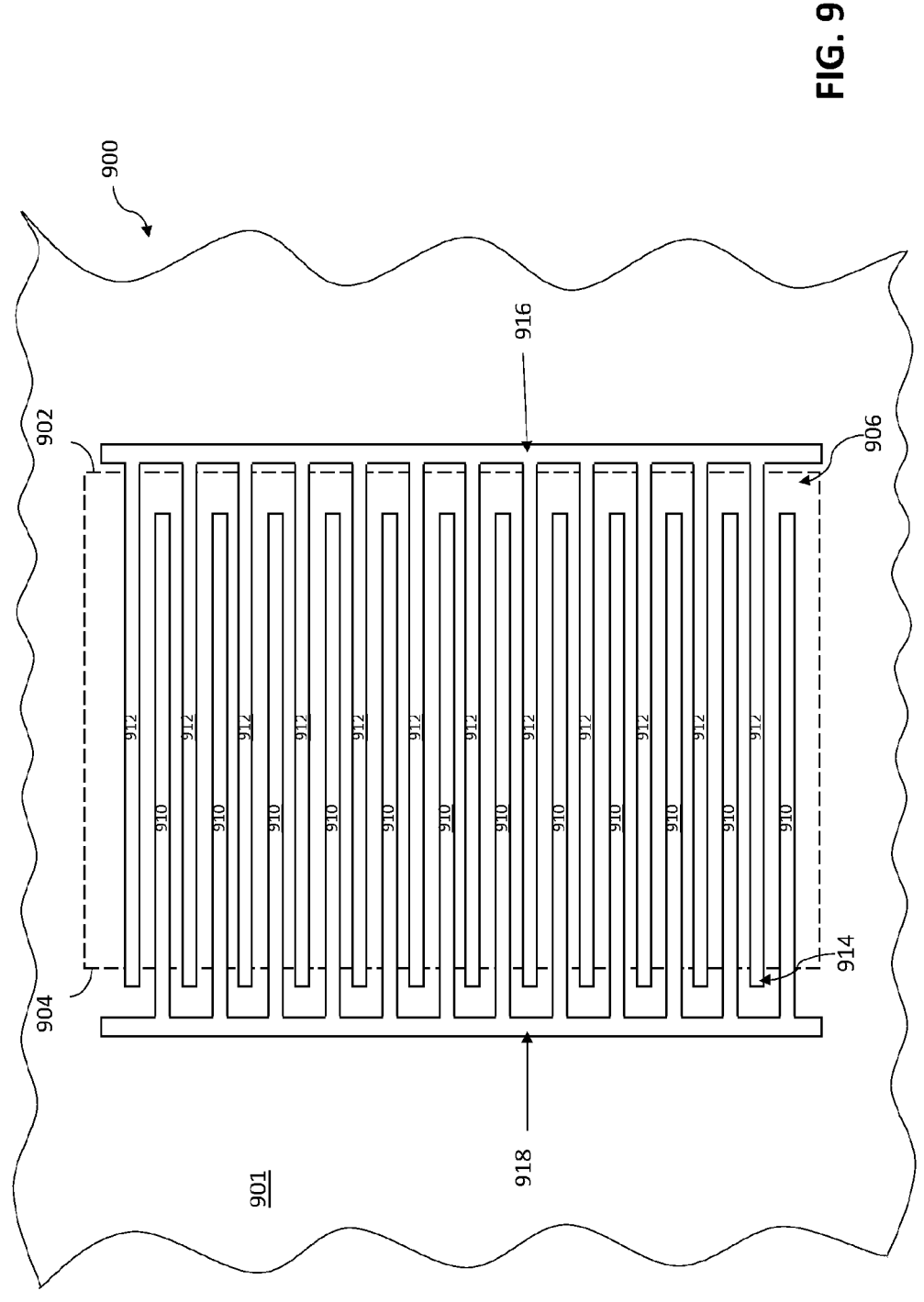
FIG. 9 is a top, schematic view of a MEMS transducer with an array of beams in accordance with another example.

FIG. 9 depicts a transducer 900 having an array of beams in accordance with another example. Beams 910 and 912 are suspended over a cavity 906 in a substrate 901. Tips 914 of the fixed-fixed beams 912 extend over edge 904 of the cavity 906 and are anchored on top of the substrate 901. The distance between edge 904 and tip 914 may be set such that any over-etch of the cavity 906 that extends past edge 904 does not reach the tip 914. Each of the fixed-fixed beams 912 are electrically connected through a conductive trace 916 that is fixed to the substrate 901. Similarly, each of the fixed-free beams 910 are electrically connected through a conductive trace 918 that is fixed to the substrate 901. Conductive traces 916 and 918 may be further connected to a bond pads through which external connection can be made (e.g. through wire bonds).

Figure 10:
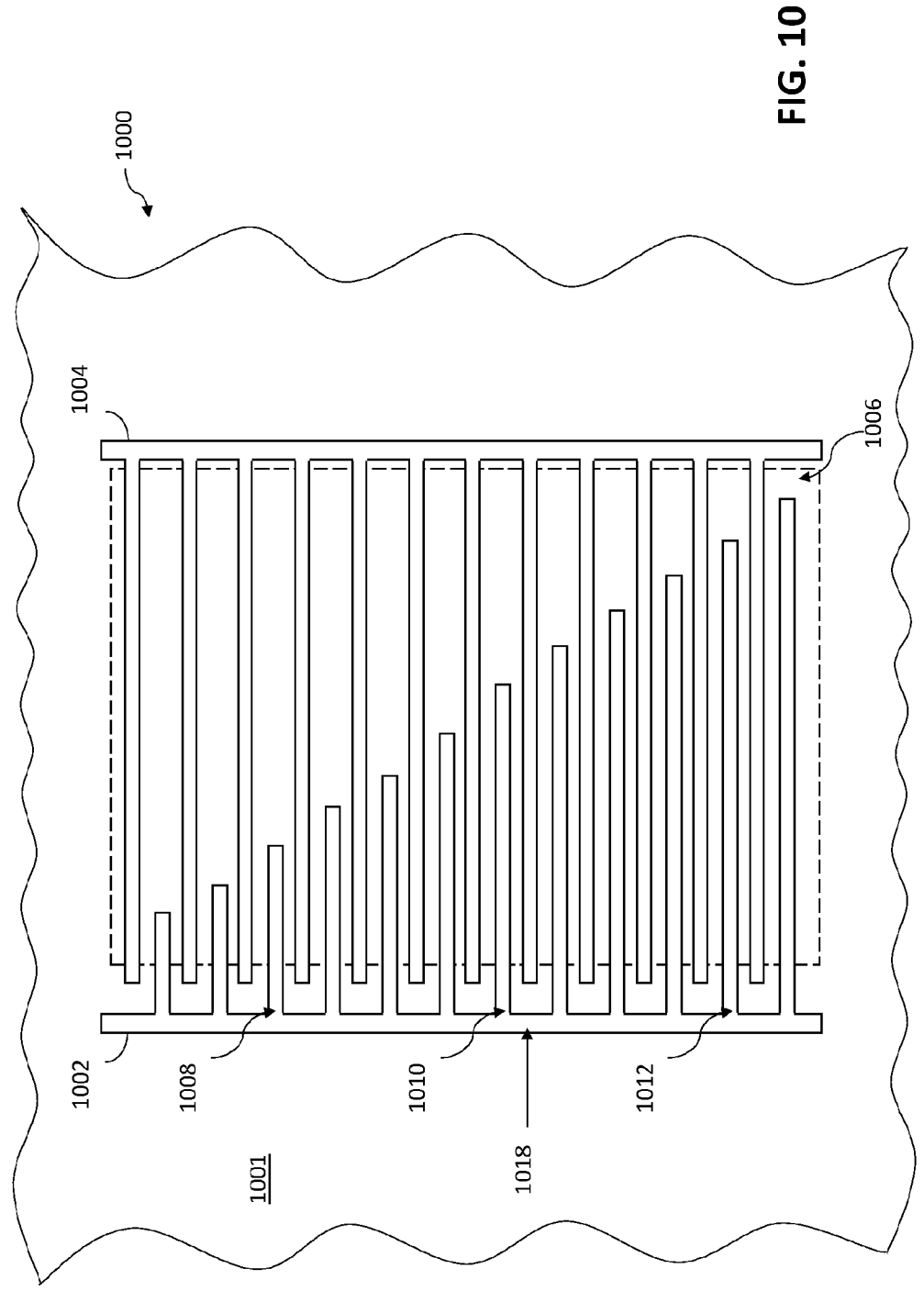
FIG. 10 is a top, schematic view of a MEMS transducer with an array of beams of different lengths in accordance with one example.

FIG. 10 depicts a transducer 1000 that includes an array of beams with different lengths in accordance with one example. The transducer 1000 includes a set of fixed-free beams 1002 and fixed-fixed beams 1004 suspended over a cavity 1006 in substrate 1001. Cantilever array 1002 may include at least one beam 1008 that is shorter in length than another beam 1010. Alternatively or additionally, cantilever array 1002 may include at least one beam 1012 that is longer in length than beam 1010. In one example, cantilever array 1002 may include of fixed-free beams that are increasing (e.g., monotonically increasing) in length. The incremental increase in length of each cantilever beam relative to the beam before the cantilever beam may be equal or different. The length of each cantilever beam may be tuned to exhibit a specific resonant frequency. In another example, the incremental changes in length of the beams may be randomized. Each beam in the cantilever array 1002 may be connected electrically through a conductive trace 1018 such that the change in capacitance seen by transducer 1000 when excited by is an average of all the cantilever beams 1002. In some examples, the beams of transducer 1000 may vary in length and fall in a range from about 50 um to about 1000 um, but other lengths may be used.

Figure 11:
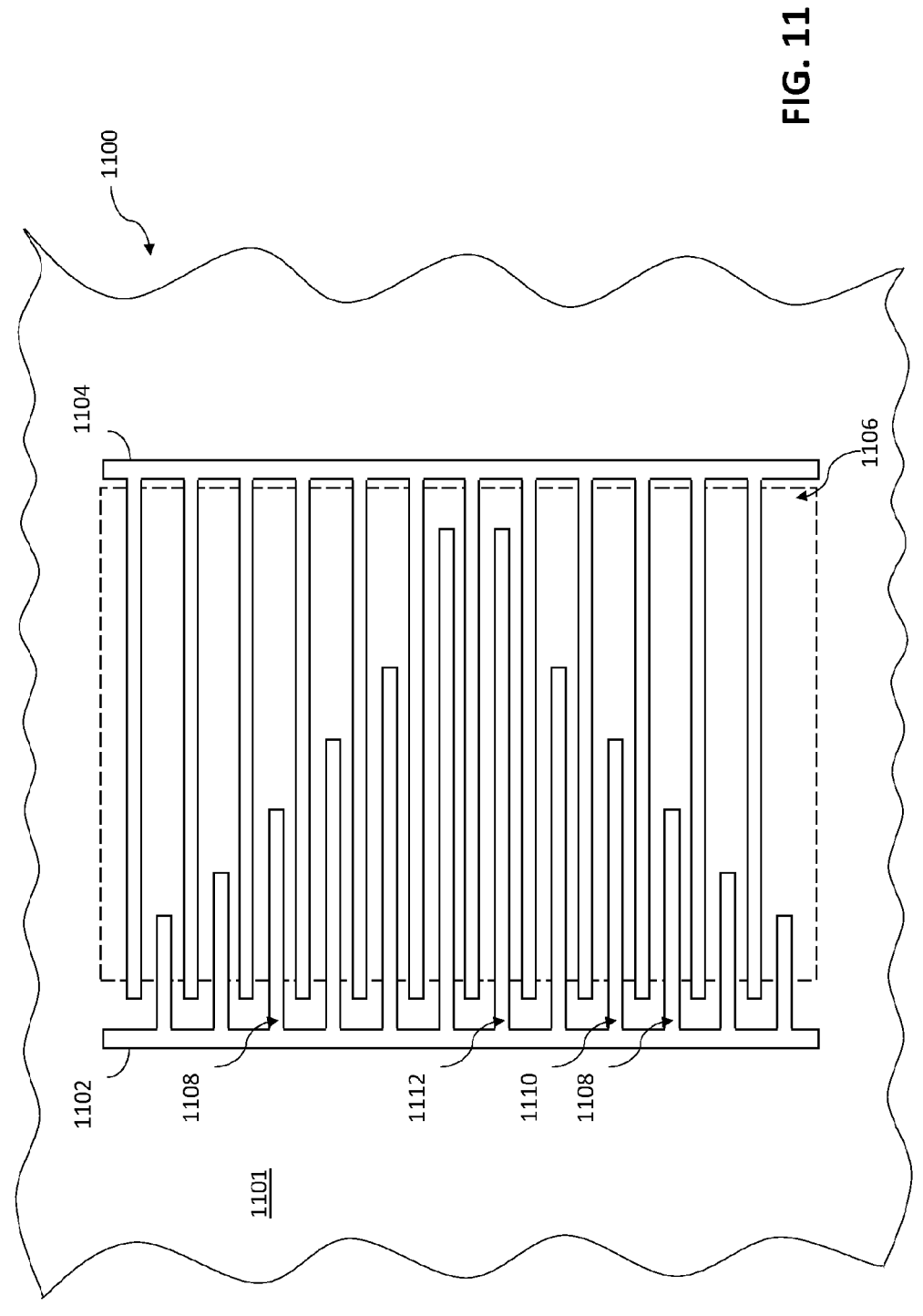
FIG. 11 is a top, schematic view of a MEMS transducer with an array of beams of different lengths in accordance with another example.

FIG. 11 depicts a transducer 1100 that includes an array of beams with different lengths in accordance with another example. The transducer 1100 includes a set of fixed-free beams 1102 and fixed-fixed beams 1104 suspended over a cavity 1106 formed through a substrate 1101. Cantilever array 1102 includes at least one beam 1108 that is shorter in length than beam 1110 and at least one beam 1112 that is longer in length than beam 1110. In some examples, the longest beams may be positioned in the interior of the cavity 1106 with the shortest beams at the edges or exterior. The beams 1108 symmetrically opposing the center beam 1112 may be equal in length. The beams from the top edge of the cavity 1106 may increase in length until the beams are disposed in the middle of the cavity 1106, and then proceed to decrease in length as the approach the other edge of cavity 1106. In some examples, acoustic excitation at higher frequencies may be greatest near the edges of the cavity 1106 and acoustic excitation at lower frequencies may be greatest near the middle of the cavity 1106. The length of each beam in array 1102 may be set such that the resonance of each beam matches the frequency that passes through that position in the cavity 1106 with greatest sensitivity.

Figure 12:
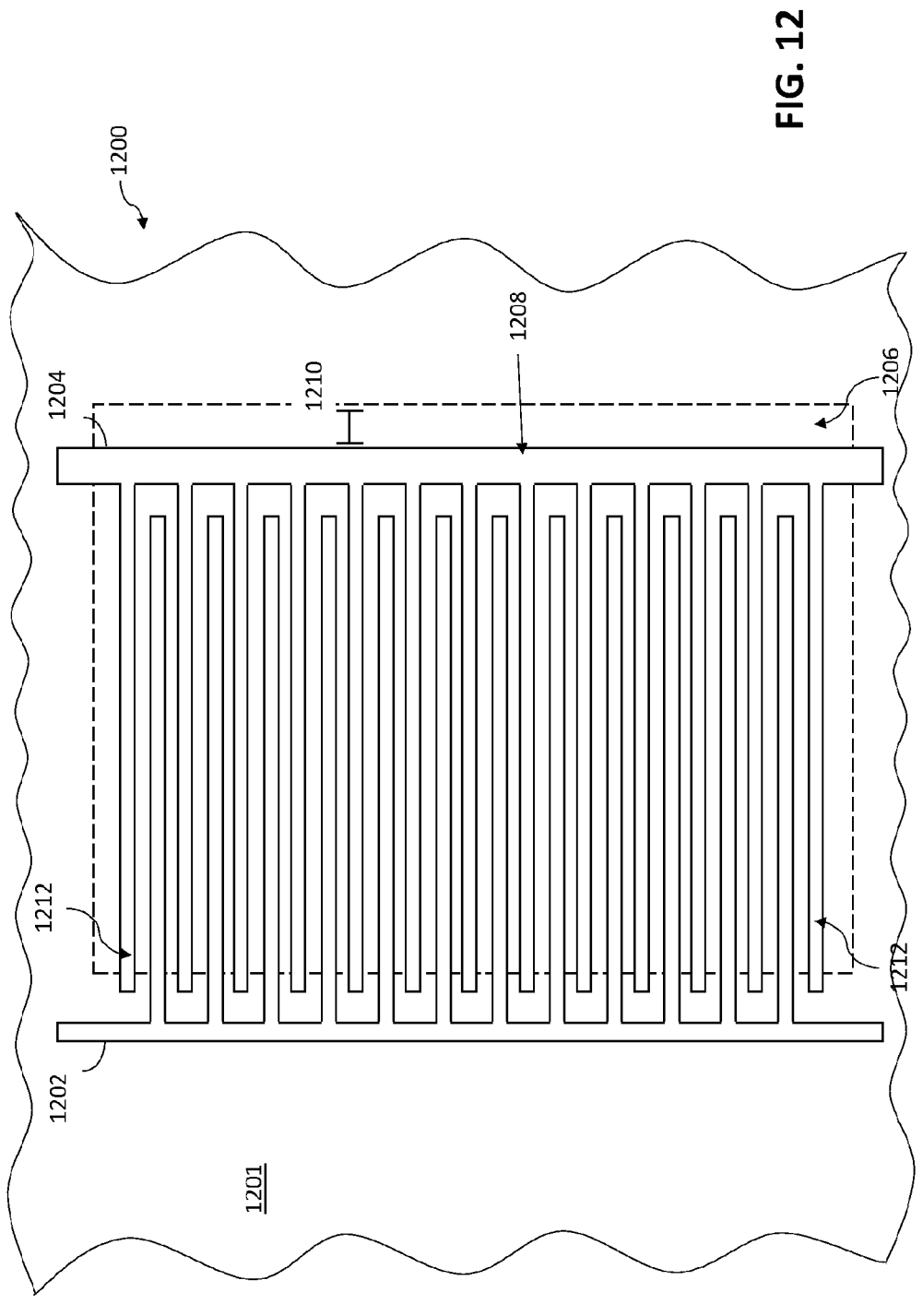
FIG. 12 is a top, schematic view of a MEMS transducer with an array of beams in accordance with yet another example.

FIG. 12 depicts a transducer 1200 that includes an array of beams in accordance with yet another example. The transducer 1200 includes a set of fixed-free beams 1202 and fixed-fixed beams 1204 suspended over a cavity 1206 formed through a substrate 1201. In this example, the anchor 1208 of the fixed-fixed beams 1204 is suspended over the cavity 1206. The anchor 1208 is configured such that the anchor is sufficiently stiff and does not move significantly relative to the fixed-free beams 1202 when subject to the same external stimulus (e.g., sound waves). For example, the anchor 1208 may be constructed with a greater width and/or thickness than that of the beams 1202 and 1204. The anchor 1208 is positioned at a distance 1210 from the edge of the cavity 1206. The distance 1210 is chosen such that the anchor 1208 is sufficiently far from the corners of the cavity 1206 and does not experience excessive stresses or forces during the microfabrication process.

Yet another feature of transducer 1200 is the use of fixed-fixed beams 1212 at the outer positions in the array of beams. In some examples, the electrostatic force distributed across the array of beams of transducer 1200 is nonuniform. The outer beams 1212 in the array may experience a stronger electrostatic force than the other, inner beams. And thus, it may be useful to make the outer beams stiffer than the other, inner beams in the array. In some cases, the outer beams 1212 are fixed-fixed beams. In other cases, the fixed-fixed beams 1212 may further have a larger width and/or thickness than the rest of the beams in the array 1202 and/or 1204. In yet another example, the outer beams of the array 1212 may be a fixed-free beam with a shorter length than the other beams in the array.

Figure 13:
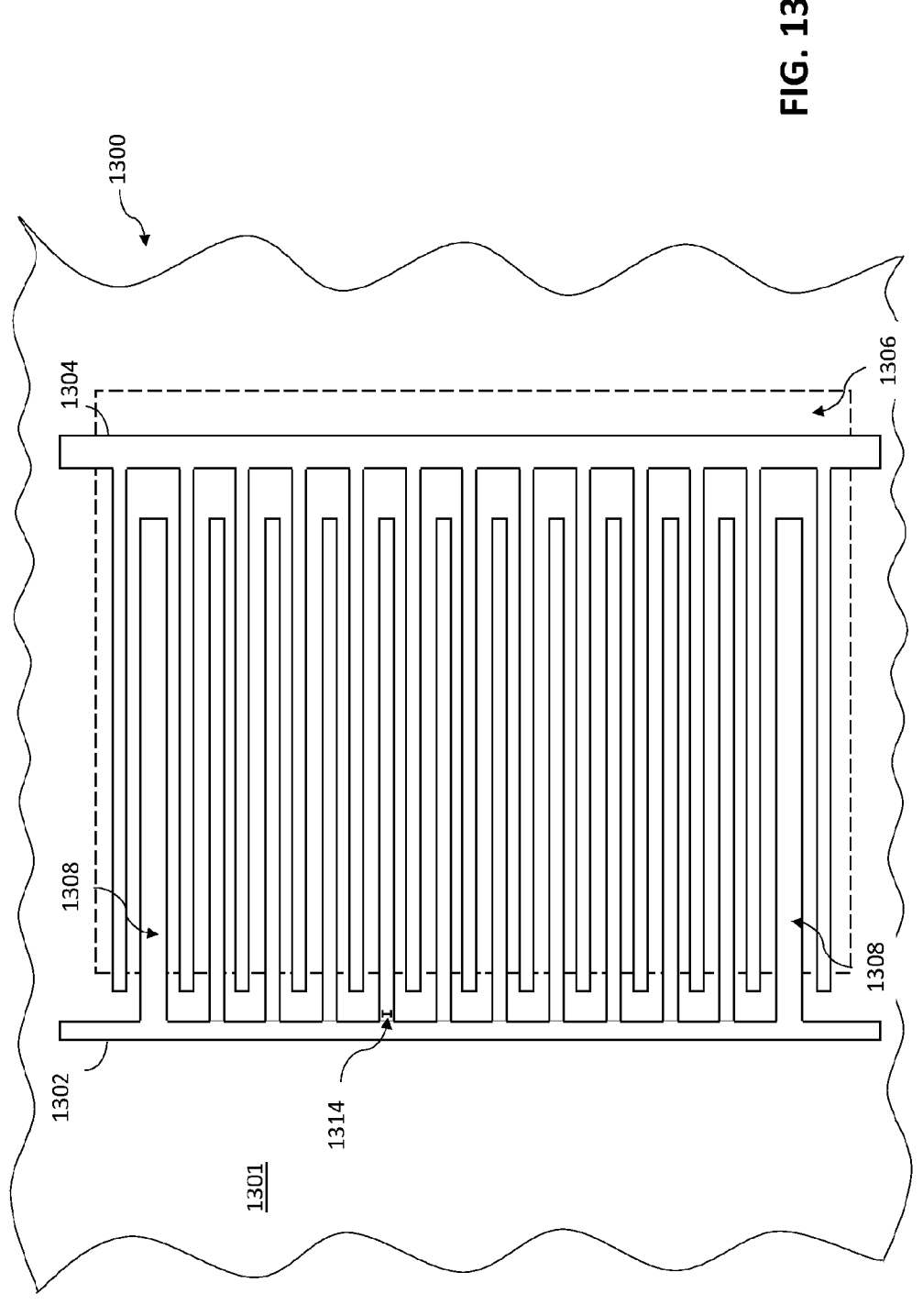
FIG. 13 is a top, schematic view of a MEMS transducer with an array of beams in accordance with yet another example.

FIG. 13 depicts a transducer 1300 that includes an array of beams in accordance with yet another example. The transducer 1300 includes a set of fixed-free beams 1302 with width 1314 and fixed-fixed beams 1304 suspended over a cavity 1306 formed through a substrate 1301. The array of fixed-free beams 1302 includes a first and last fixed-free beam 1308. The width of beams 1308 is greater than the width 1314 of the rest of the fixed-free beams in the array 1302. In another example, the beams 1308 may have a different length and/or thickness than the rest of the fixed-free beams in the array 1302.

Figure 14:
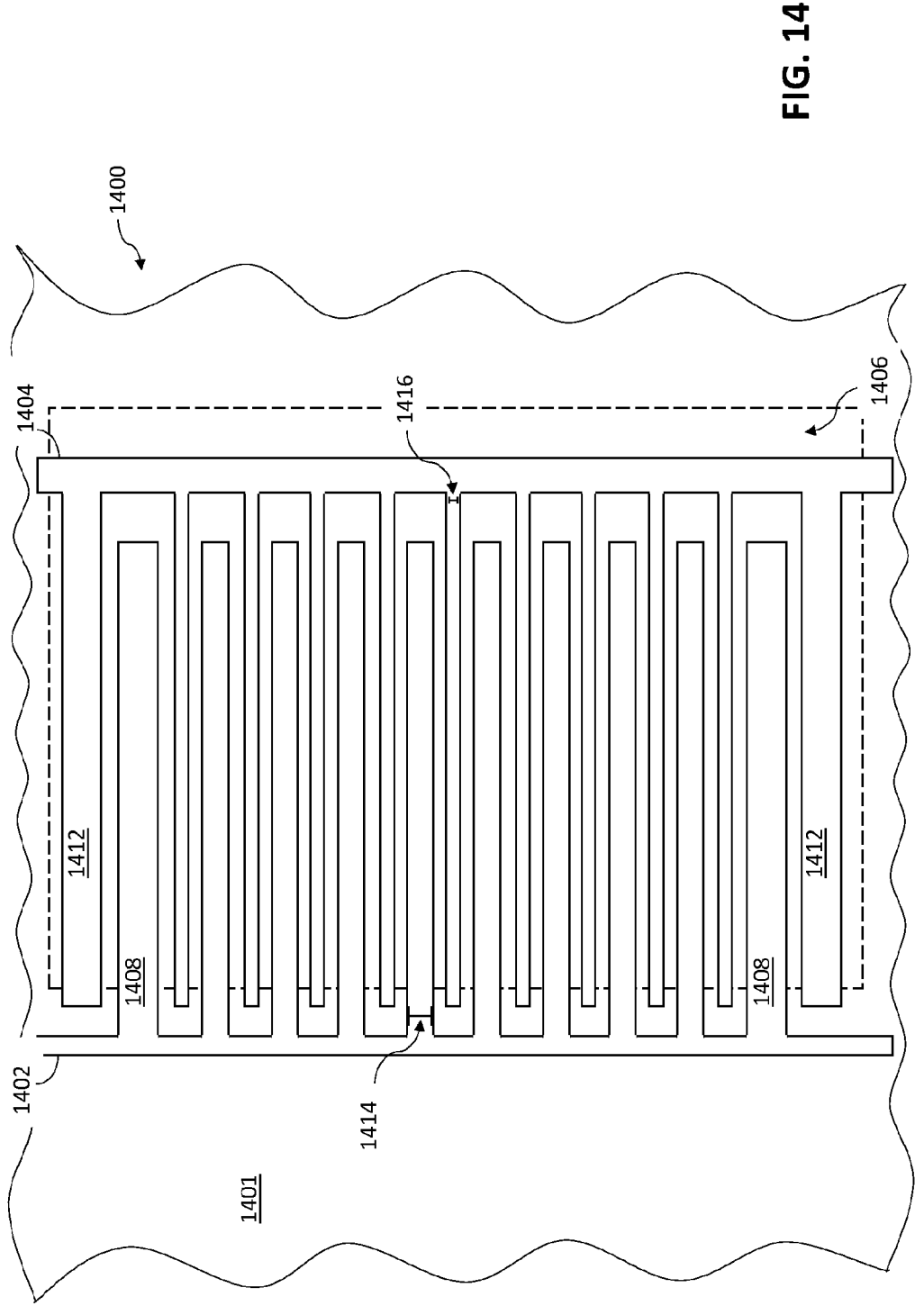
FIG. 14 is a top, schematic view of a MEMS transducer with an array of beams in accordance with yet another example.

FIG. 14 depicts a transducer 1400 that includes an array of beams in accordance with yet another example. The transducer 1400 includes a set of fixed-free beams 1402 with width 1414 and fixed-fixed beams 1404 with width 1416 suspended over a cavity 1406 formed through a substrate 1401. In this embodiment, the width of the fixed-free beams 1414 is greater than the width of the fixed-fixed beam 1416. For example, the width of the fixed-free beams 1414 may be one, two, three, or four times the width of the fixed-fixed beams 1416. Additionally or alternatively, the thickness of the fixed-free beams in array 1402 may be greater than the thickness of the fixed-fixed beams in array 1404. The fixed-free beam array 1402 has a first and last beam 1408. In one example, the width of beams 1408 is greater than width 1414. Similarly, the fixed-fixed beam array 1404 has a first and last beam 1412. In one example, the width of beams 1412 is greater than width 1416.

Figure 15:
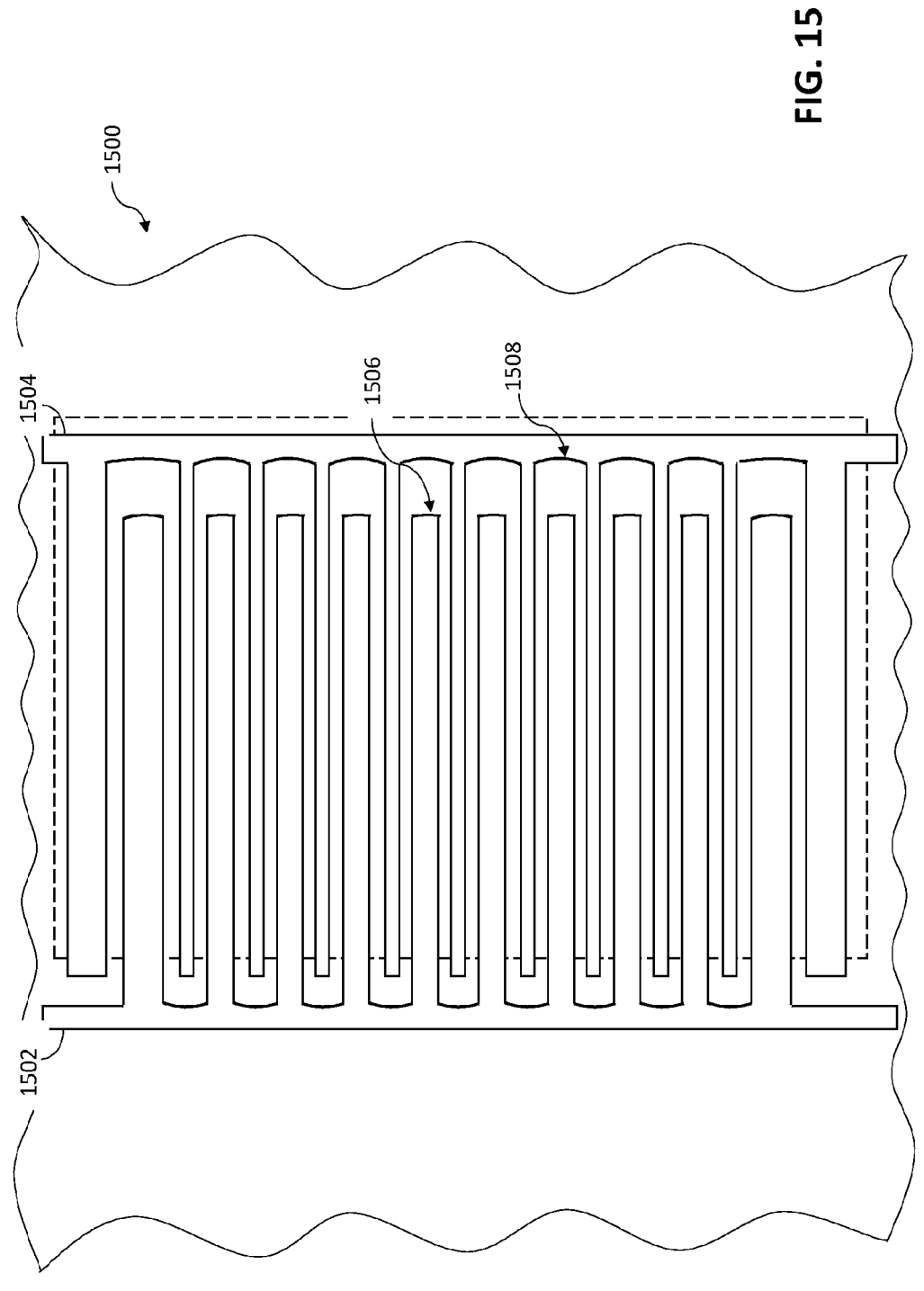
FIG. 15 is a top, schematic view of a MEMS transducer with an array of beams in accordance with yet another example.

FIG. 15 depicts a transducer 1500 that includes an array of beams in accordance with yet another example. Transducer 1500 may be configured in a manner similar to transducer 1400 (FIG. 14) in one or more aspects. Transducer 1500 may differ in that the tips of the fixed-free beams 1502 are curved. Alternatively or additionally, the regions 1508 on the fixed-fixed beam array 1504 that are directly across from the tip of the fixed-free beams 1506 are also curved in profile.

In some instances, it may be useful to increase the area of the transducer in order to increase the total capacitance of the transducer and thus performance. In some examples, transducers including plates anchored on at least one side may be constructed with larger widths (e.g., extended in the direction parallel to the edge on which they are anchored on). Transducers including arrays of beams may be extended to increase the number of beams in the array. However, these configurations cause the cavity in the substrate to be proportionally extended only along one direction. In some examples, it may be useful to have a configuration in which the transducer area is increased in the direction perpendicular to the edge on which the sensing element is anchored. This may allow for an increase in transducer area along both of its planar dimensions and enable better symmetry of the cavity or hole formed in the substrate.

Figure 16:
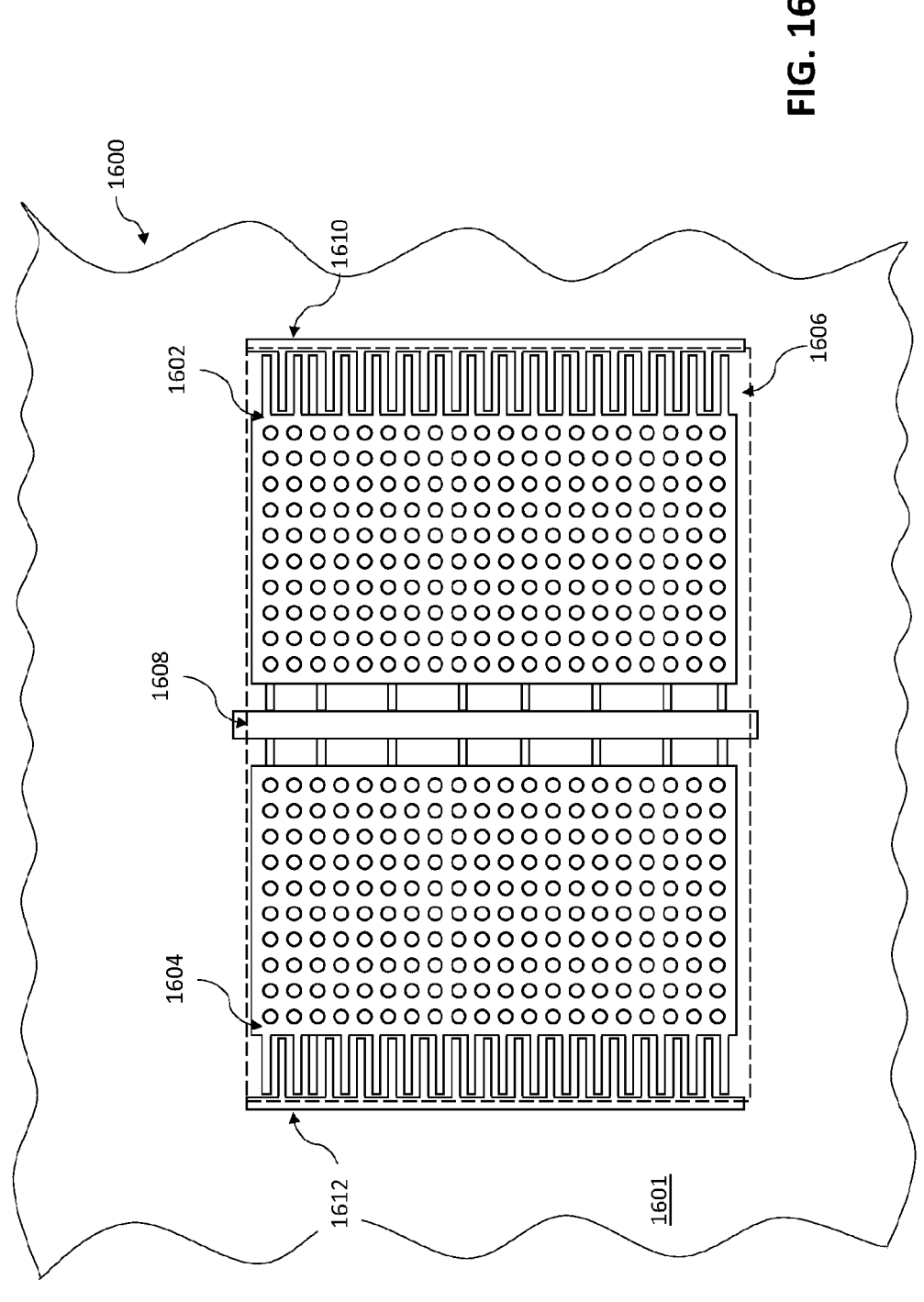
FIG. 16 is a top, schematic view of a MEMS transducer with an increased area in accordance with one example.

FIG. 16 depicts a transducer 1600 including a plate-like diaphragm with an increased area in accordance with one example. Transducer 1600 includes two plate-like diaphragms 1602 and 1604 attached to a common anchor 1608 suspending over a cavity 1606 in the substrate 1601. The plate-like diaphragms 1602 and 1604 may be similar to those described in FIGS. 5-7. As the diaphragms 1602 and 1604 are excited by a sound wave, the diaphragms may move in phase with one another. Anchor 1608 is constructed such that the anchor does not move significantly relative to the motion of diaphragms 1602 and 1604 when subject to the same external stimulus. Similarly, fixed electrodes 1610 and 1612 are fixed to the substrate 1601 and do not move significantly relative to the motion of diaphragms 1602 and 1604 when subject to the same external stimulus. As diaphragms 1602 and 1604 vibrate, the diaphragms create a change in capacitance with electrodes 1610 and 1612 respectively. In one example, the anchor 1608 connects diaphragms 1602 and 1604 such that each diaphragm shares the same conductive layers. If a bias voltage is placed on fixed electrodes 1610 and 1612, then an electrical signal may be sensed from at least one conductive layer in anchor 1608 that approximates the total capacitance change seen by transducer 1600. By sensing a signal from the suspended anchor 1608, the parasitic capacitance between the sensing electrode and substrate 1601 can be minimized. In another example, at least one bias voltage may be placed on anchor 1608 and shared by diaphragms 1602 and 1604. In this case, the total capacitance change seen by transducer 1600 can be sensed by electrically connecting fixed electrodes 1610 and 1612 either using a conductive trace above the substrate 1601 or externally to the transducer 1600. The edge of the cavity, or deep reactive ion etch (DRIE) hole, may be placed at the edge of electrodes 1610 and 1612 such that an undercutting during the DRIE process will help to reduce parasitic capacitances between the electrodes 1610 and 1612 and the substrate. In yet another example, the transducer 1600 may include a first output corresponding to the capacitance change seen between diaphragm 1602 and fixed electrode 1610 and a second output corresponding to the capacitance change seen between diaphragm 1604 and fixed electrode 1612. This may be useful in examples where the transducer 1600 is constructed in such a way that diaphragms 1602 and 1604 move out-of-phase relative to one another.

Figure 17:
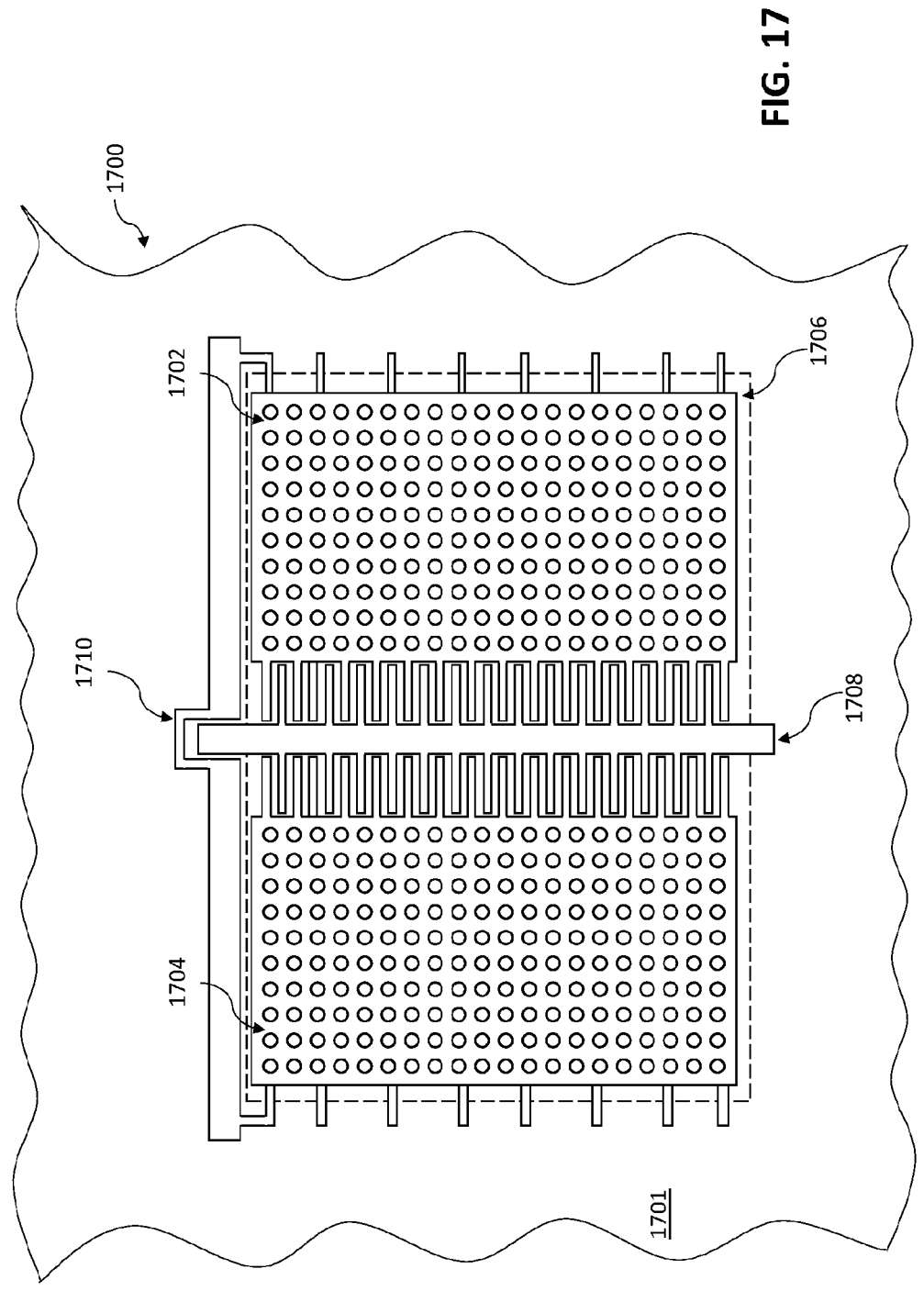
FIG. 17 is a top, schematic view of a MEMS transducer with an increased area in accordance with another example.

FIG. 17 depicts a transducer 1700 including a plate-like diaphragm with an increased area in accordance with another example. Transducer 1700 is similar to transducer 1600 except with the diaphragms inverted. In transducer 1700, the plate-like diaphragms 1702 and 1704 are attached directly to the substrate 1701 and suspended over the cavity 1706. The fingers of the diaphragm 1702 and 1704 are positioned at the center of the cavity 1706 and interdigitated with fixed fingers, or electrodes, of the suspended anchor 1708. Anchor 1708 is configured such that the anchor does not move significantly relative to the motion of diaphragms 1702 and 1704 when subject to the same external stimulus. In one example, a conductive trace 1710 may connect diaphragms 1702 and 1704 such that each diaphragm shares the same conductive layers. One or more bias voltages may be placed on diaphragms 1702 and 1704 and an electrical signal may be sensed from at least one conductive layer in anchor 1708 that approximates the total capacitance change seen by transducer 1700. By sensing the signal change from the suspended anchor 1708, the parasitic capacitance between the sensing electrode and substrate 1701 can be minimized. In another example, one or more bias voltages may be placed on one or more conductive layers of anchor 1708. In this case, the total capacitance change seen by transducer 1700 can be sensed by at least one conductive layer in 1702, 1704, or 1710. In yet another example, conductive trace 1710 may be removed such that the transducer 1700 includes a first output corresponding to the capacitance change seen between diaphragm 1702 and fixed electrode 1708 and a second output corresponding to the capacitance change seen between diaphragm 1704 and fixed electrode 1708.

Figure 18:
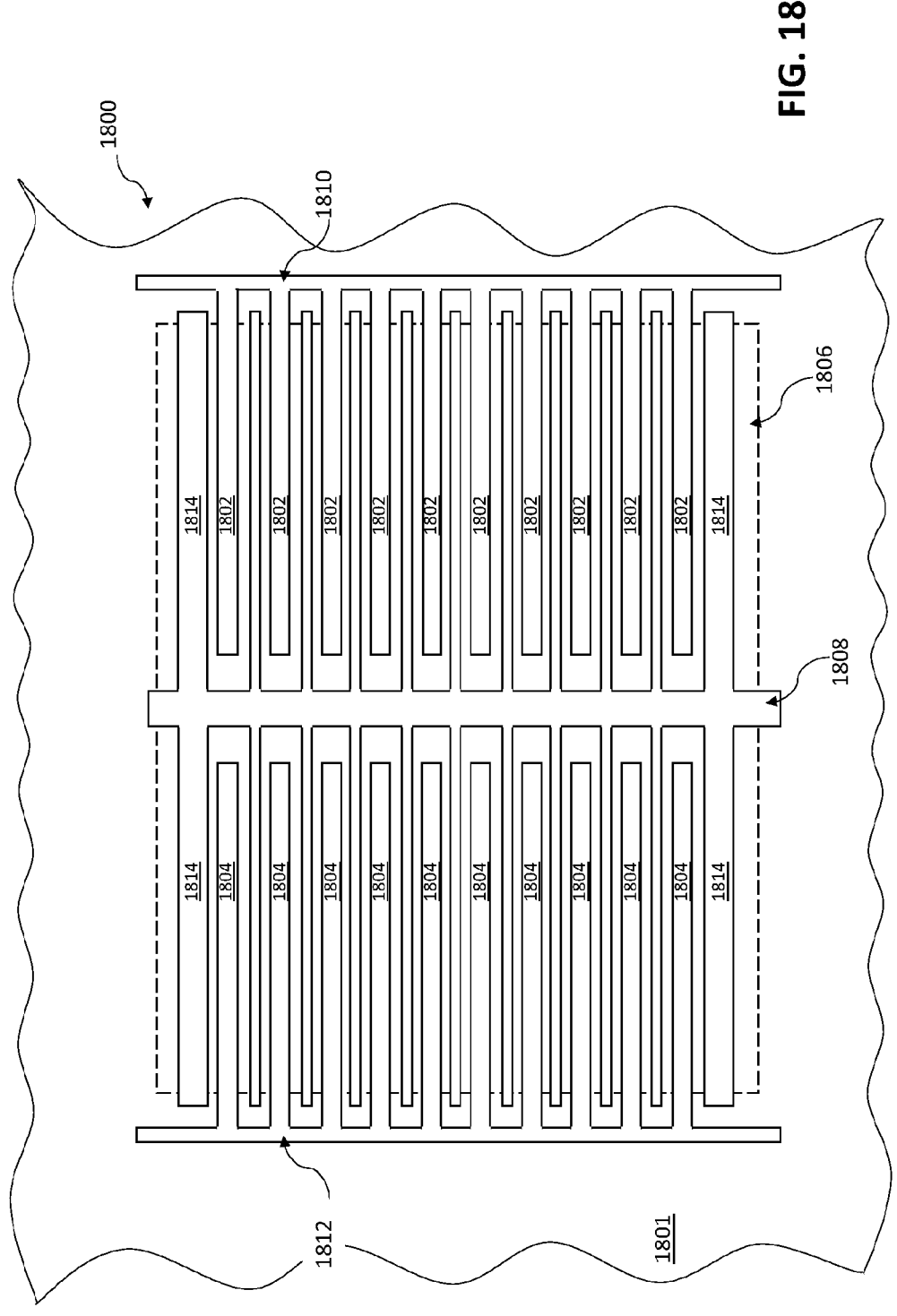
FIG. 18 is a top, schematic view of a MEMS transducer with an increased area in accordance with yet another example.

FIG. 18 depicts a transducer 1800 including an array of beams with an increased area in accordance with one example. Transducer 1800 includes two sets of fixed-free beams 1802 and 1804 suspended over cavity 1806 and anchored to substrate 1801. The fixed-free beams 1802 are connected via conductive trace 1810 and the fixed-free beams 1804 are connected via the conductive trace 1812. The fixed-free beams 1802 and 1804 are interdigitated between fixed-fixed beams connected to the anchor 1808 and suspended over the cavity 1806. In some examples, the width of fixed-free beams 1802 and/or 1804 may be greater than or less than the width of the fixed-fixed beams. The fixed-fixed beam array has a set of first and last beams 1814.

In some examples, the width of beams 1814 may be greater than the other fixed-fixed beams and/or the fixed-free beams 1802 and 1804. In other examples, the length, width, and/or thickness of at least one of the fixed-free beams 1802 may be different than at least one of the fixed-free beams 1804. The beam arrays of transducer 1800 may be similar to those described in FIGS. 8-15.

Anchor 1808 and its associated fixed-fixed beams are configured such that they do not move significantly relative to the motion of fixed-free beams 1802 and 1804 when subject to the same external stimulus. As the fixed-free beams 1802 and 1804 vibrate, the beams create a change in capacitance with the fixed-fixed beams anchored to 1808 and the substrate. In one example, one or more bias voltages are placed on the fixed-fixed beams and an electrical signal is sensed from at least one of the conductive layers in 1810 and/or 1812. In another example, one or more bias voltages are placed on at least one conductive layer of 1810 and/or 1812 and an electrical signal is sensed from at least one conductive layer in the fixed-fixed beams 1808. By sensing off the suspended anchor 1808, the parasitic capacitance between the sensing electrode and substrate can be minimized.

Figure 19:
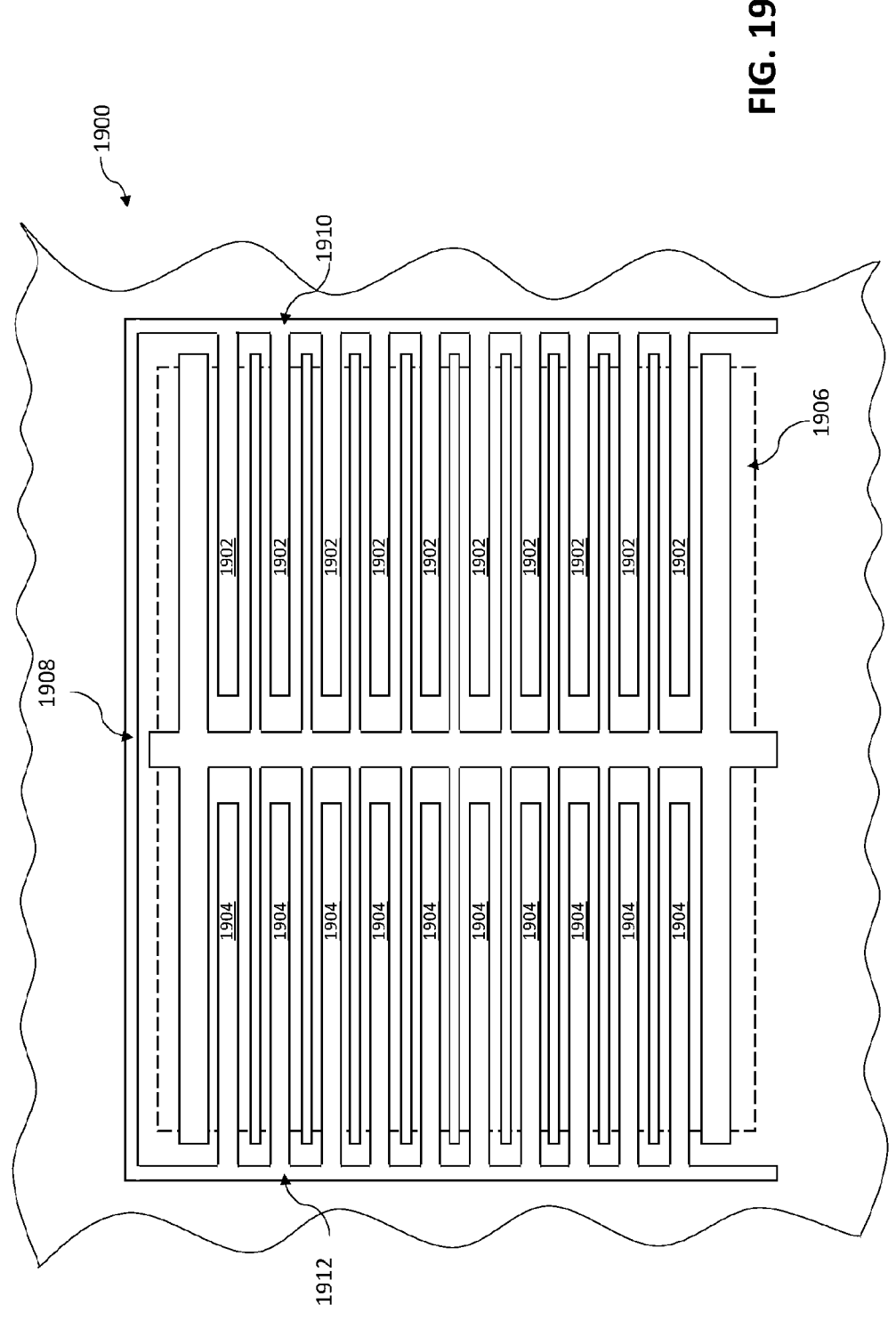
FIG. 19 is a top, schematic view of a MEMS transducer with an increased area in accordance with yet another example.

In some examples, it may be useful to electrically connect the conductive traces 1810 and 1812 so the motion of fixed-free beams can be sensed using a single external connection. FIG. 19 depicts one such embodiment. Transducer 1900, similar to transducer 1800, includes at least two sets of fixed-free beams 1902 and 1904 suspended over the cavity 1906 and connected to conductive traces 1910 and 1912 respectively. Conductive traces 1910 and 1912 are further connected by conductive trace 1908 such that fixed-free beams 1902 and 1904 see the same electric potential.

As the area of the MEMS transducer is increased, the area of the cavity etched into the substrate increases accordingly. In some instances, it may be useful to etch multiple, smaller cavities in the substrate rather than one larger cavity. This may also allow for the creation of transducers covering more area without an excessively long suspended structures such as fixed anchors.

Figure 20:
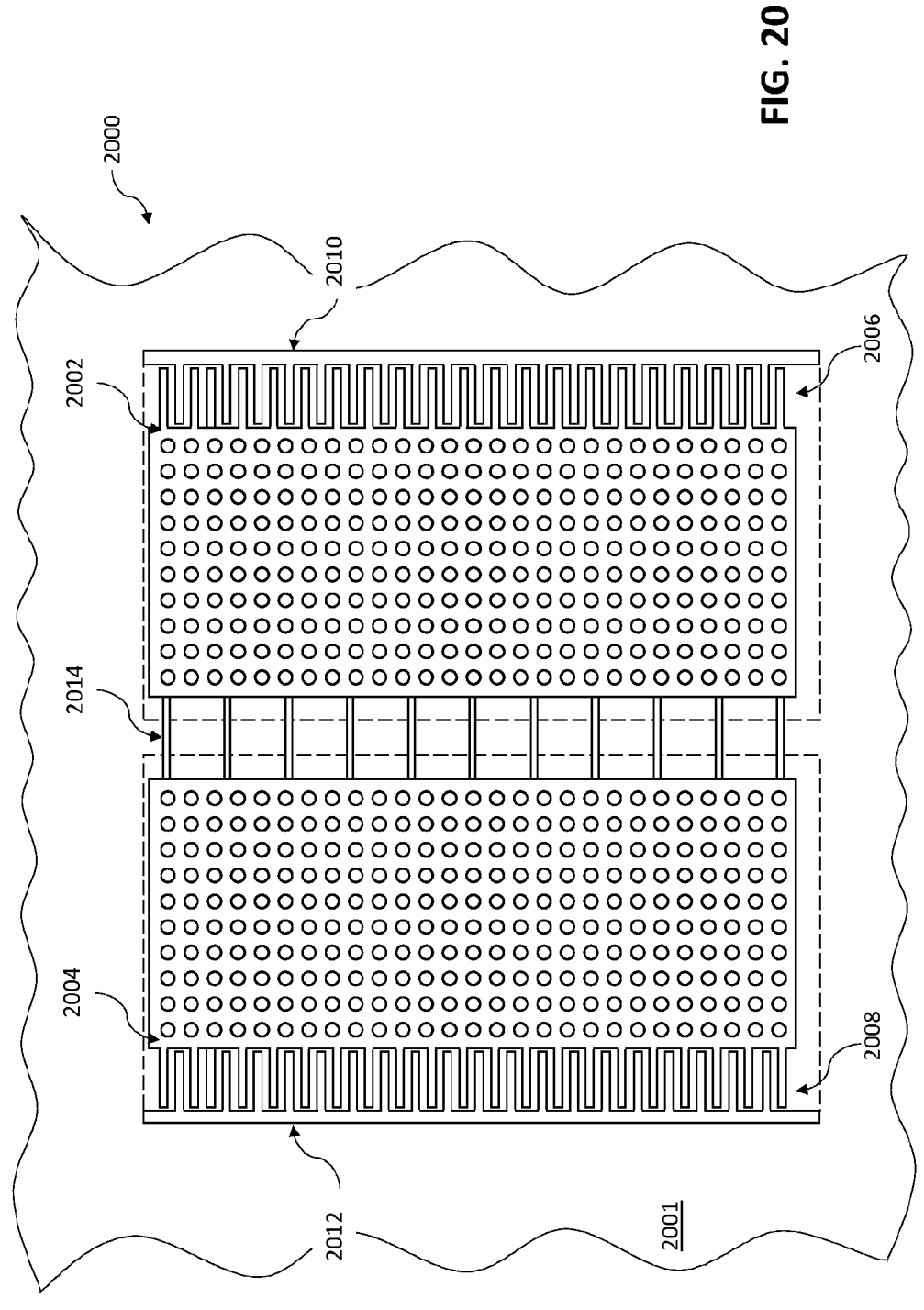
FIG. 20 is a top, schematic view of a MEMS transducer with multiple cavities in accordance with one example.

FIG. 20 depicts a transducer 2000 that includes a plate-like diaphragm with multiple cavities in accordance with one example. Transducer 2000 includes two plate-like diaphragms 2002 and 2004 connected by anchors 2014. The plate-like diaphragms 2002 and 2004 may be similar to those described in FIGS. 5-7. The transducer 2000 includes a first cavity 2006 through the substrate 2001 over which diaphragm 2002 is suspended and a second cavity 2008 through the substrate 2001 over which diaphragm 2004 is suspended. The anchors 2014 connecting diaphragms 2002 and 2004 are also fixed to the substrate 2001 of transducer 2000. As the diaphragms 2002 and 2004 are excited, the diaphragms may move in phase with one another. Fixed fingers, or electrodes, 2010 and 2012 are fixed to the substrate 2001 and do not move significantly relative to the motion of diaphragms 2002 and 2004 when subject to the same external stimulus. As diaphragms 2002 and 2004 vibrate, they create a change in capacitance with electrodes 2010 and 2012 respectively. In one example, the anchors 2014 connect diaphragms 2002 and 2004 such that each diaphragm shares the same conductive layers. If a bias voltage is placed on fixed electrodes 2010 and 2012, then an electrical signal may be sensed from at least one conductive layer in anchor 2014 that approximates the total capacitance change seen by transducer 2000. In another example, at least one bias voltage may be placed on a conductive layer in anchors 2014 and shared by diaphragms 2002 and 2004. In this case, the total capacitance change seen by transducer 2000 can be sensed by electrically connecting fixed electrodes 2010 and 2012. In yet another example, the transducer 2000 may include a first output corresponding to the capacitance change seen between diaphragm 2002 and fixed electrode 2010 and a second output corresponding to the capacitance change seen between diaphragm 2004 and fixed electrode 2012. This may be useful in examples where the transducer 2000 is constructed in such a way that the diaphragms 2002 and 2004 move out-of-phase relative to one another.

In some examples, the first and second cavity 2006 and 2008 may have equal dimensions. In other examples, the first and second cavity 2006 and 2008 may have different dimensions. The first and second cavity 2006 and 2008 may have any orientation relative to one another. For example, they may be placed horizontally, vertically, or diagonally from one another. The first and second cavity 2006 and 2008 may also be offset from one another such that the top of cavity 2006 is above or below the top of a horizontally placed cavity 2008. Similarly, the left edge of cavity 2006 maybe be placed to the left or right of the left edge of a vertically placed cavity 2008. Rather than having two diaphragms 2002 and 2004 connected by anchors 2014, transducer 2000 may include separate diaphragms individually suspended over the cavities 2006 and 2008. In some examples, these diaphragms may resemble those described in FIGS. 16 and 17. These diaphragms may be connected with an additional conductive trace or a connection external to the transducer 2000. In some examples, transducer 2000 may include more than two cavities. The more than two cavities may be positioned in any arrangement relative to one another. For example, when transducer 2000 includes four cavities, the four cavities may be positioned to form the shape of a horizontal line, vertical line, rectangle, or cross.

Figure 21:
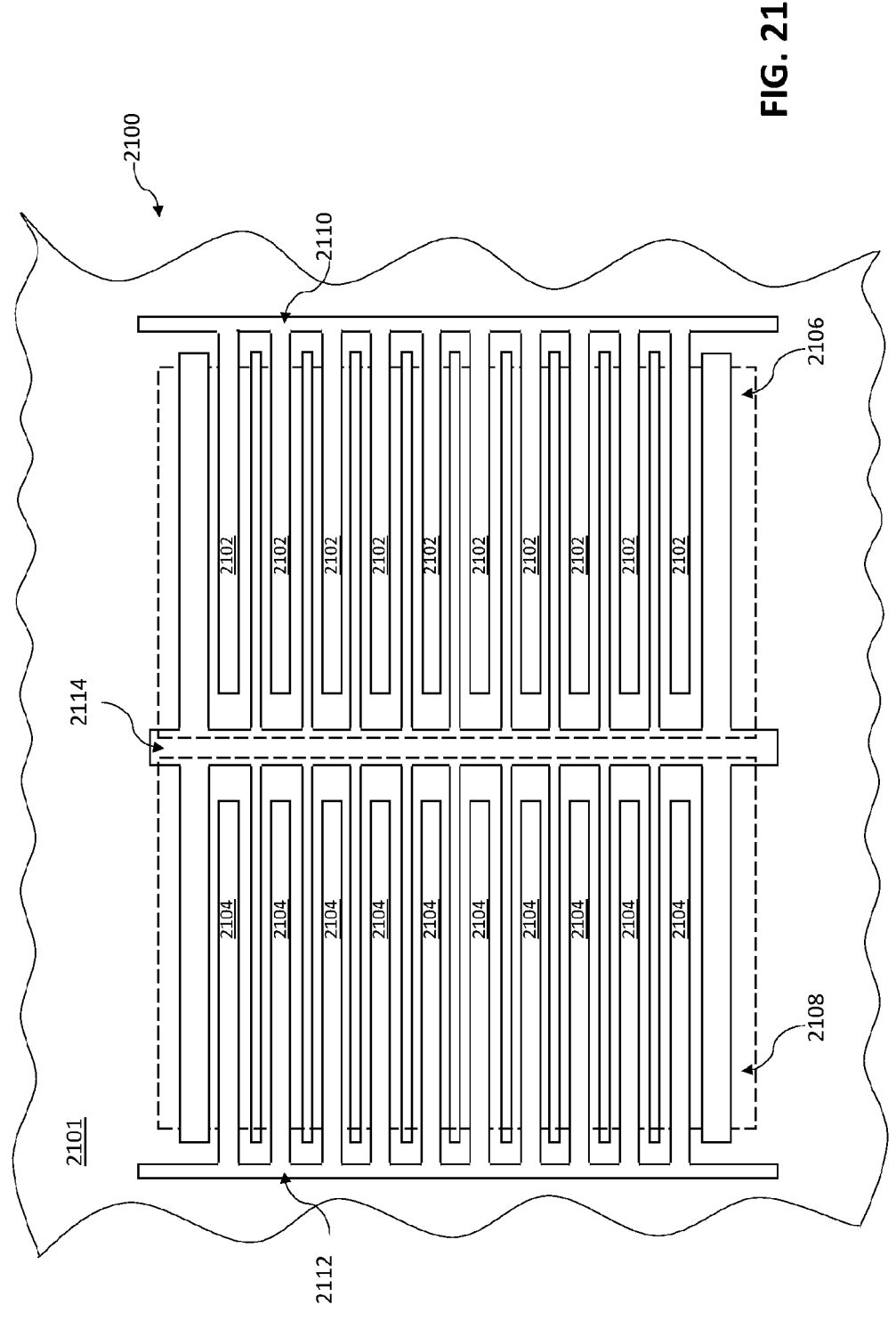
FIG. 21 is a top, schematic view of a MEMS transducer with multiple cavities in accordance with another example.

FIG. 21 depicts a transducer 2100 including an array of beams with multiple cavities in accordance with one example. Transducer 2100 includes two arrays of fixed-free beams 2102 and 2104. Fixed-free beams 2102 are connected through trace 2110 and fixed-free beams 2104 are connected through trace 2112. The fixed-free beams are interdigitated with fixed-fixed beams connected to anchor 2114. The array of beams may be similar to those described in FIGS. 8-15. The transducer 2100 includes a first cavity 2106 through the substrate 2101 over which fixed-free beams 2102 are suspended and a second cavity 2108 through the substrate 2101 over which fixed-free beams 2104 are suspended. The anchor 2114 connecting the fixed-fixed beams may be partially or completely fixed to the substrate 2101 of transducer 2100. As the fixed-free beams 2102 and 2104 are excited, the beams may move in phase with one another. The fixed-fixed beams connected to anchor 2114 are fixed to the substrate 2101 and do not move significantly relative to the motion of fixed-free beams 2102 and 2104 when subject to the same external stimulus. As fixed-free beams 2102 and 2104 vibrate, they create a change in capacitance with the fixed-fixed beams. An electrical signal may be sensed by any of the methods described in the previous examples.

The first cavity and the second cavity 2106 and 2108 may have equal or different dimensions and have any orientation relative to one another as described in FIG. 20. Rather than having one array of fixed-fixed beams connected to anchor 2114, transducer 2100 may include separate fixed-fixed beam arrays individually suspended over the cavities 2106 and 2108. In some examples, each cavity 2106 and 2108 may include an array of beams that resemble those described in FIG. 18-19. These arrays of beams may be connected with additional conductive traces or connections external to the transducer 2100. In some examples, transducer 2100 may include more than two cavities placed in any orientation as described in FIG. 20.

Figure 22:
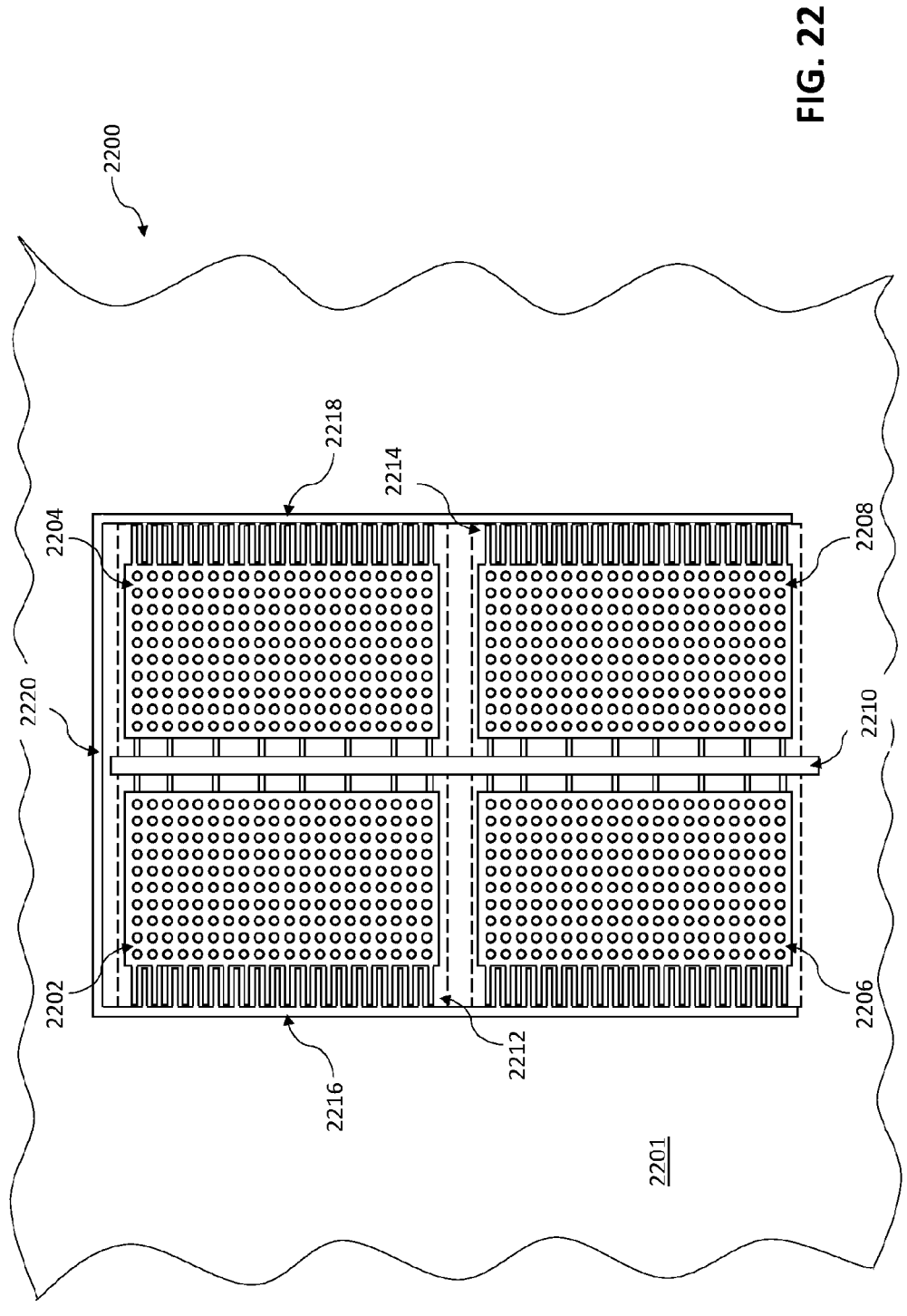
FIG. 22 is a top, schematic view of a MEMS transducer with multiple cavities in accordance with yet another example.

FIG. 22 depicts a transducer 2200 including a plate-like diaphragm with multiple cavities in accordance with another example. Transducer 2200 includes four plate-like diaphragms 2202, 2204, 2206, and 2208 connected to anchor 2210. The plate-like diaphragms 2202, 2204, 2206, and 2208 may be similar to those described in FIGS. 7-9. The transducer 2200 includes a first cavity 2212 through the substrate 2201 over which diaphragms 2202 and 2204 are suspended and a second cavity 2214 through the substrate 2201 over which diaphragms 2206 and 2208 are suspended. At least one part of the anchor 2210 connecting diaphragms 2202, 2204, 2206, and 2208 may be suspended over at least one cavity 2212 and/or 2214. At least one part of the anchor 2210 may also be fixed to the substrate 2201 of transducer 2200. In some examples, the anchor 2210 may include multiple anchors connected electrically or mechanically. As the diaphragms 2202, 2204, 2206, and 2208 are excited, the diaphragms may move in phase with one another. Electrodes 2216 and 2218 are fixed to the substrate and do not move significantly relative to the diaphragms 2202, 2204, 2206, and 2208 when subject to the same external stimulus. Electrodes 2216 and 2218 may be further connected through a conductive trace 2220. As diaphragms 2202, 2204, 2206, and 2208 vibrate, the diaphragms create a change in capacitance with electrodes 2216 and 2218. In one example, the anchor 2210 connects diaphragms 2202, 2204, 2206, and 2208 such that each diaphragm shares the same conductive layers. An electrical signal may be sensed by any of the methods described in the previous examples. The first and second cavities 2206 and 2208 may have equal or different dimensions and have any orientation relative to one another as described previously. In some examples, a transducer such those described in FIGS. 16, 17, and 20 may be suspended above cavity 2212 and/or cavity 2214. In some examples, transducer 2200 may include more than two cavities. The more than two cavities may be positioned in any arrangement relative to one another as described in connection with previous figures.

Figure 23:
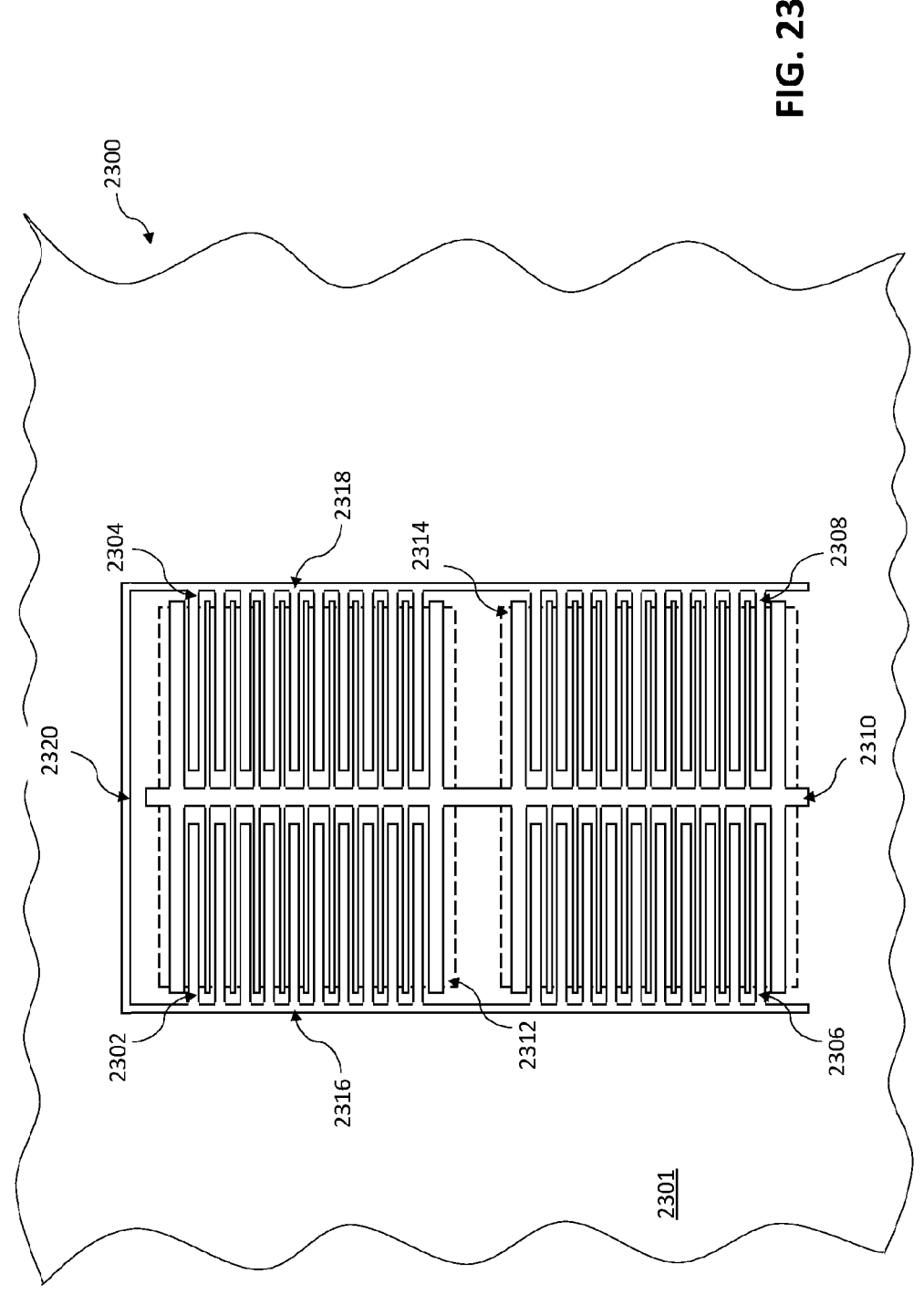
FIG. 23 is a top, schematic view of a MEMS transducer with multiple cavities in accordance with yet another example.

FIG. 23 depicts a transducer 2300 including an array of beams with multiple cavities in accordance with another example. Transducer 2300 includes four arrays of fixed-free beams 2302, 2304, 2306, and 2308 fixed to a substrate 2301. The beam arrays 2302, 2304, 2306, and 2308 may be similar to those described in FIGS. 8-15. The transducer 2300 includes a first cavity 2312 through the substrate 2301 over which the fixed-free beam arrays 2302 and 2304 are suspended and a second cavity 2314 through the substrate 2301 over which the fixed-free beam arrays 2306 and 2308 are suspended. The fixed-free beams 2302, 2304, 2306, and 2308 are interdigitated with fixed-fixed beams connected to the anchor 2310. At least one part of the anchor 2310 is suspended over at least one of the cavities 2312 and/or 2314. At least one part of the anchor 2310 may also be fixed to the substrate of transducer 2300. In some examples, the anchor 2310 may include multiple anchors connected electrically or mechanically. As the fixed-free beams 2302, 2304, 2306, and 2308 are excited, the beams may move in phase with one another. Electrodes 2316 and 2318 are fixed to the substrate 2301 and connected to the fixed-free beams 2302, 2304, 2306, and 2308. Electrodes 2316 and 2318 may be further connected through a conductive trace 2320. The fixed-fixed beams and anchor 2310 do not move significantly relative to the motion of fixed-free beams 2302, 2304, 2306, and 2308 when subject to the same external stimulus. As fixed-free beams 2302, 2304, 2306, and 2308 vibrate, they create a change in capacitance with the fixed-fixed beams. In one example, the anchor 2310 connects the fixed-fixed beams such that they share the same conductive layers. An electrical signal may be sensed by any of the methods described in the previous examples. The first and second cavities 2306 and 2308 may have equal or different dimensions and have any orientation relative to one another as described previously. In some examples, a transducer such those described in FIGS. 18, 19, and 21 may be suspended above cavity 2312 and/or cavity 2314. In some examples, transducer 2300 may include more than two cavities. The more than two cavities may be positioned in any arrangement relative to one another as previously described.

In some instances, the MEMS transducer may include four or more transducers. This may allow for even further increased capacitive area and sensitivity. Additionally, such a configuration may be used to sense sound coming from two or more directions. Pairs of transducers may be used to capture only sound propagating along a specific direction. In this manner, the transducer may have multiple outputs, with each output corresponding to sound only travelling along a unique direction. The outputs of the transducers may be amplified (e.g., using an ASIC) and sent to a computing device for further processing. The computing device may use the multiple transducer outputs to provide a signal corresponding to a direction not specifically captured by the transducer (e.g., beamforming). It may also use the multiple transducer outputs to enhance the audio of a captured sound, such as speech, while eliminating unwanted sound such as background noise.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A microelectromechanical (MEMS) transducer comprising:
   a substrate;
   a moveable electrode supported by the substrate; and
   a pair of fixed electrodes supported by the substrate, each fixed electrode of the pair of fixed electrodes being configured as a bias electrode or as a sense electrode; wherein:
      the pair of fixed electrodes are disposed in a stacked arrangement;
      an end of the moveable electrode is configured for vibrational movement along the stacked arrangement during excitation of the moveable electrode; and
      the pair of fixed electrodes are laterally spaced apart from the end of the moveable electrode to establish a capacitance indicative of the vibrational movement; and
      the stacked arrangement is configured such that, during the vibrational movement, the moveable electrode reaches or crosses a midpoint of at least one of the pair of fixed electrodes.

2. The MEMS transducer of claim 1, wherein the moveable electrode is configured as a cantilever.

3. The MEMS transducer of claim 2, wherein the cantilever is warped in the direction of the vibrational movement apart from the vibrational movement.

4. The MEMS transducer of claim 2, wherein the cantilever has a resting deflection that corresponds with an equilibrium position attained via application of bias voltages between the moveable electrode and the pair of fixed electrodes.

5. The MEMS transducer of claim 1, wherein the moveable electrode comprises a porous plate.

6. The MEMS transducer of claim 5, wherein the moveable electrode further comprises a plurality of fingers extending outward from an edge of the porous plate.

7. The MEMS transducer of claim 1, wherein:
   the moveable electrode comprises an anchor and a plurality of porous plates; and
   each porous plate of the plurality of porous plates is connected to the anchor.

8. The MEMS transducer of claim 7, wherein:
   the substrate comprises a hole; and
   the anchor is suspended over the hole.

9. The MEMS transducer of claim 1, wherein the moveable electrode comprises an array of beams.

10. The MEMS transducer of claim 9, wherein the array of beams comprises fixed-fixed beams and fixed-free beams disposed in an alternating arrangement.

11. The MEMS transducer of claim 10, wherein the fixed-free beams are wider than the fixed-fixed beams.

12. The MEMS transducer of claim 9, wherein the array of beams comprises a plurality of fixed-free beams of differing lengths.

13. The MEMS transducer of claim 9, wherein outer beams of the array of beams are configured as fixed-fixed beams.

14. The MEMS transducer of claim 9, wherein outer beams of the array of beams are wider than all other beams in the array of beams.

15. The MEMS transducer of claim 9, wherein each fixed electrode of the pair of fixed electrodes comprises a set of beams, the sets of beams being interleaved in a side-by-side arrangement with the array of beams of the moveable electrode.

16. The MEMS transducer of claim 1, wherein:
   the substrate comprises a hole; and
   the fixed electrode comprises two sets of beams suspended over the hole.

17. The MEMS transducer of claim 16, wherein the fixed electrode further comprises an anchor to which the two sets of beams are connected.

18. The MEMS transducer of claim 17, wherein the anchor is disposed between the two sets of beams and suspended over the hole.

19. The MEMS transducer of claim 1, wherein first and second fixed electrodes of the pair of fixed electrodes have positive and negative biases, respectively, with respect to the moveable electrode.

20. A device comprising the MEMS transducer of claim 1, the device further comprising an amplifier coupled to the moveable electrode.

21. A device comprising the MEMS transducer of claim 1, the device further comprising an amplifier coupled to one or both of the pair of fixed electrodes.

22. A microelectromechanical (MEMS) transducer comprising:
   a substrate;
   a moveable electrode supported by the substrate, wherein the moveable electrode comprises a porous plate and a plurality of fingers extending outward from an edge of the porous plate; and a pair of fixed electrodes supported by the substrate, each fixed electrode of the pair of fixed electrodes being configured as a bias electrode or as a sense electrode; wherein:

the pair of fixed electrodes are disposed in a stacked arrangement;

an end of the moveable electrode is configured for vibrational movement along the stacked arrangement during excitation of the moveable electrode; and the pair of fixed electrodes are laterally spaced apart from the end of the moveable electrode to establish a capacitance indicative of the vibrational movement.

23. A microelectromechanical (MEMS) transducer comprising:

a substrate;

a moveable electrode supported by the substrate; and a pair of fixed electrodes supported by the substrate, each fixed electrode of the pair of fixed electrodes being configured as a bias electrode or as a sense electrode; wherein:

first and second fixed electrodes of the pair of fixed electrodes have positive and negative biases, respectively, with respect to the moveable electrode;

the pair of fixed electrodes are disposed in a stacked arrangement;

an end of the moveable electrode is configured for vibrational movement along the stacked arrangement during excitation of the moveable electrode; and the pair of fixed electrodes are laterally spaced apart from the end of the moveable electrode to establish a capacitance indicative of the vibrational movement.

* * * * *